(12) United States Patent
Ogasawara

(10) Patent No.: US 10,784,073 B2
(45) Date of Patent: Sep. 22, 2020

(54) BLANKING DEFLECTOR, AND MULTI CHARGED PARTICLE BEAM WRITING APPARATUS USING THREE DEFLECTOR ELECTRODES AND A TRANSMISSION LINE

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

( * ) Notice: Subject to any disclaimer, the term of this patent is extended or adjusted under 35 U.S.C. 154(b) by 65 days.

(21) Appl. No.: 15/814,950

(22) Filed: Nov. 16, 2017

(65) Prior Publication Data

US 2018/0166248 A1 Jun. 14, 2018

(30) Foreign Application Priority Data

Dec. 8, 2016 (JP) .................................. 2016-238801

(51) Int. Cl.
*H01J 37/147* (2006.01)
*H01J 37/04* (2006.01)
(Continued)

(52) U.S. Cl.
CPC .............. *H01J 37/147* (2013.01); *G03F 7/20* (2013.01); *H01J 37/045* (2013.01);
(Continued)

(58) Field of Classification Search
None
See application file for complete search history.

(56) References Cited

U.S. PATENT DOCUMENTS

| 6,188,074 B1* | 2/2001 | Satoh ..................... B82Y 10/00 |
| | | 250/492.22 |
| 2003/0209674 A1* | 11/2003 | Hamaguchi ............ B82Y 10/00 |
| | | 250/492.2 |

(Continued)

FOREIGN PATENT DOCUMENTS

| JP | 11-150055 | 6/1999 |
| JP | 2010-225728 | 10/2010 |
| JP | 2014-112639 | 6/2014 |

OTHER PUBLICATIONS

Munehiro Ogasawara, et al. "Development of a fast beam-blanking system", SPIE, vol. 3412, 1998, 8 pages.

*Primary Examiner* — James Choi
(74) *Attorney, Agent, or Firm* — Oblon, McClelland, Maier & Neustadt, L.L.P.

(57) ABSTRACT

A blanking deflector includes a first electrode being plate-like, a second electrode electrically separated from the first electrode, and arranged such that a first space is formed between the first and second electrodes, and a third electrode electrically separated from the first electrode, and arranged such that a second space, sufficiently wider than the first space, is formed between the first and third electrodes, wherein a transmission line, in which the second and third electrodes are electrically connected at, at least, input and output sides, is formed by the first, second, and third electrodes, multi-beams of a charged particle beam are made to pass through the second space between the first and third electrodes, and the multi-beams are deflected for blanking control by a voltage signal applied from the input side to between the first electrode, and a connected group of the second and third electrodes electrically connected.

10 Claims, 24 Drawing Sheets

(51) Int. Cl.
*H01J 37/304* (2006.01)
*G03F 7/20* (2006.01)
*H01J 37/317* (2006.01)

(52) U.S. Cl.
CPC ........ *H01J 37/304* (2013.01); *H01J 37/3177* (2013.01); *H01J 37/1472* (2013.01); *H01J 2237/0435* (2013.01); *H01J 2237/0437* (2013.01); *H01J 2237/31766* (2013.01)

(56) References Cited

U.S. PATENT DOCUMENTS

| | | | |
|---|---|---|---|
| 2004/0141169 A1* | 7/2004 | Wieland | B82Y 10/00 |
| | | | 355/133 |
| 2005/0199827 A1* | 9/2005 | Nagano | B82Y 10/00 |
| | | | 250/492.1 |
| 2007/0075256 A1* | 4/2007 | Buller | B82Y 10/00 |
| | | | 250/396 R |
| 2010/0237261 A1 | 9/2010 | Nishiyama | |
| 2013/0252145 A1* | 9/2013 | Matsumoto | H01J 7/3007 |
| | | | 430/30 |
| 2014/0124684 A1 | 5/2014 | Matsumoto et al. | |
| 2015/0155138 A1* | 6/2015 | Yoshikawa | H01J 37/3177 |
| | | | 250/492.22 |

* cited by examiner

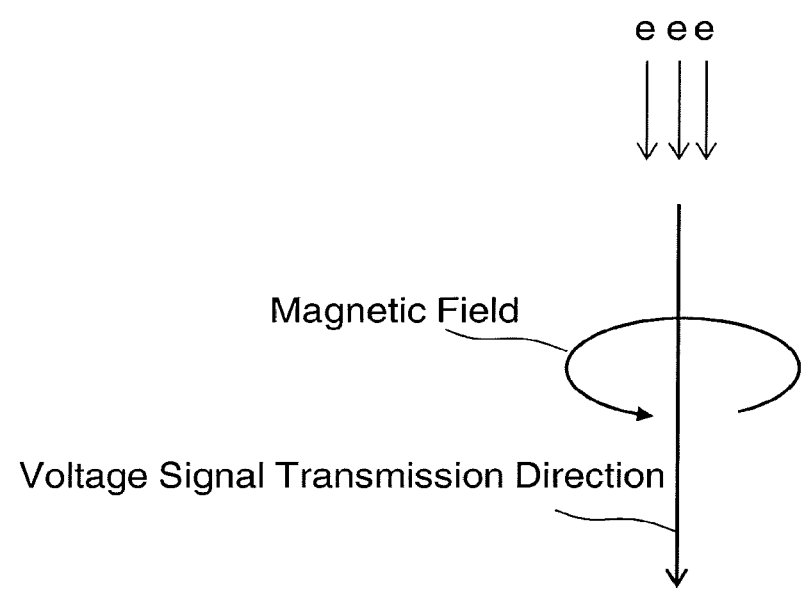
FIG.8A
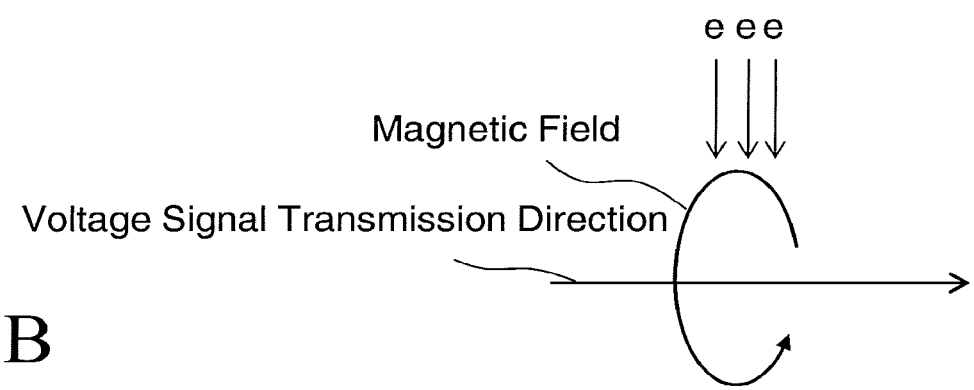
FIG.8B
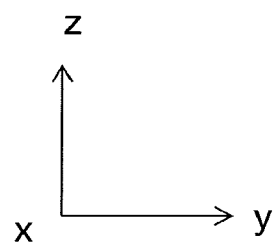

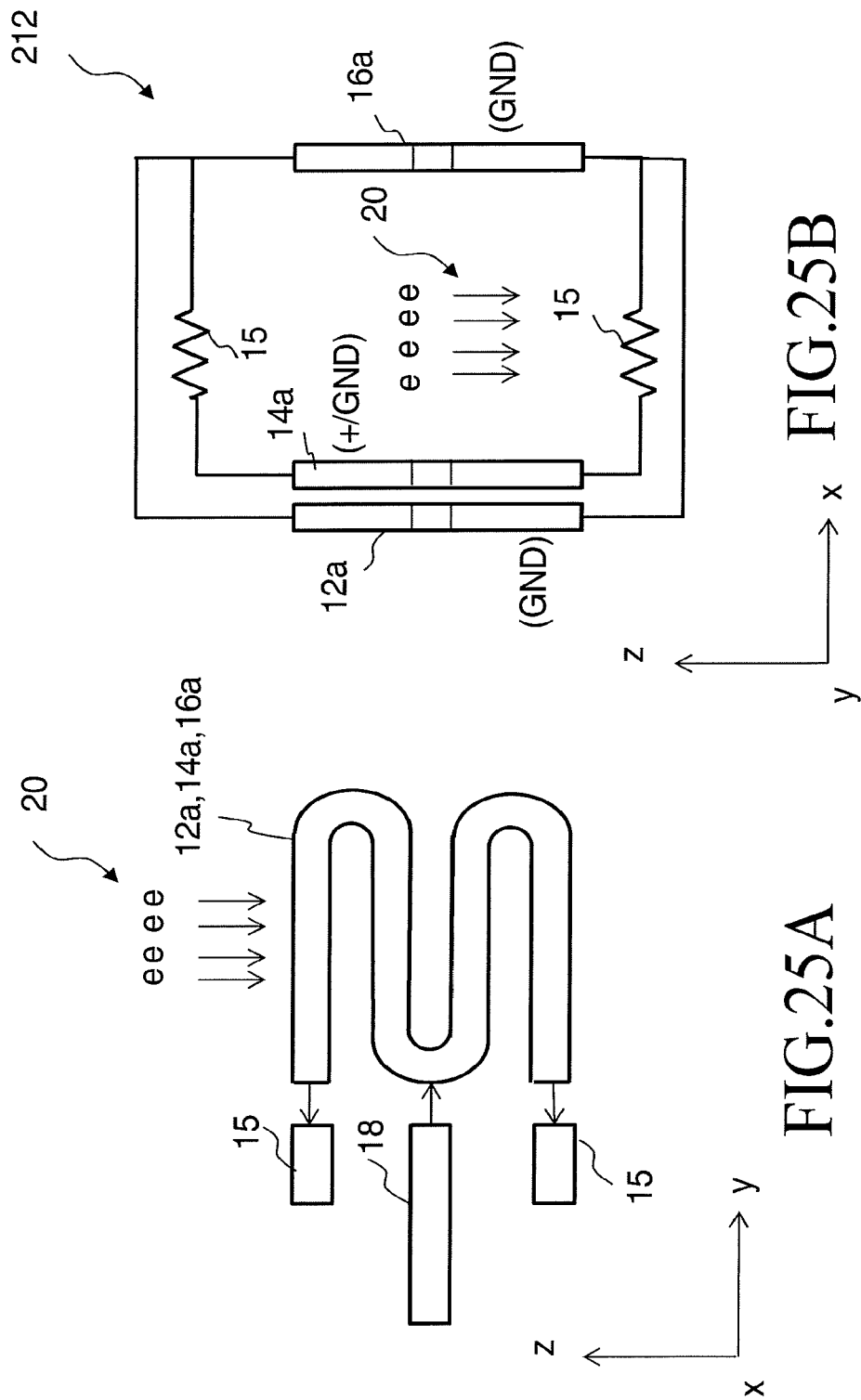

BLANKING DEFLECTOR, AND MULTI CHARGED PARTICLE BEAM WRITING APPARATUS USING THREE DEFLECTOR ELECTRODES AND A TRANSMISSION LINE

CROSS-REFERENCE TO RELATED APPLICATION

This application is based upon and claims the benefit of priority from the prior Japanese Patent Application No. 2016-238801 filed on Dec. 8, 2016 in Japan, the entire contents of which are incorporated herein by reference.

BACKGROUND OF THE INVENTION

Field of the Invention

Embodiments of the present invention relate to a blanking deflector and a multi charged particle beam writing apparatus, and, for example, to a deflector used for blanking control in multi beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" a mask pattern on a mask blank with electron beams.

For example, as a known example of employing the electron beam writing technique, there is a writing apparatus using multi-beams. Since it is possible for multi-beam writing to irradiate multiple beams at a time, the writing throughput can be greatly increased in comparison with single electron beam writing. For example, a writing apparatus employing the multi-beam technique forms multi-beams by letting portions of an electron beam emitted from an electron gun individually pass through a corresponding one of a plurality of holes in a mask, performs blanking control for each beam, reduces each unblocked beam by an optical system in order to reduce a mask image, and deflects the beam by a deflector to irradiate a desired position on a target object or "sample".

When performing highly precise writing in multi-beam writing, the dose of each beam is individually controlled based on an irradiation time in order to give a specified dose onto each position on a target object. For highly accurately controlling the dose of each beam, blanking control to provide an ON or OFF condition of each beam should be carried out at high speed. Conventionally, in a writing apparatus of the multi-beam system, a blanking control circuit for each beam is placed on the blanking plate where each blanking electrode of multi-beams is arranged. Controlling is independently performed for each beam. For example, a trigger signal for causing a beam to be ON is sent to control circuits of all the beams. In responsive to the trigger signal, the control circuit of each beam applies a beam-ON voltage to an electrode, and simultaneously, starts counting the irradiation time period by a counter. Then, when the irradiation time has been completed, it applies a beam-OFF voltage. In performing such a control a 10-bit control signal has been used, for example. However, since the space for placing the circuit on the blanking plate and the amount of current to be used are restricted, there is no alternative but to have an uncomplicated circuit in regard to the amount of information of the control signal. Therefore, it has been difficult to build in a blanking circuit which can perform an operation at high speed and high precision. Further, installing a blanking control circuit for each beam on the blanking plate restricts narrowing the pitch of multi-beams.

In order to solve the above problem, proposed is a mechanism where, in addition to individual blanking electrodes for respective beams, deflectors are provided outside the ends of the multi-beams, in the latter part of the optical path, in a manner such that the deflectors are on the both sides of the entire multi-beams so as to control the exposure time by collectively deflecting the entire multi-beams at high speed by the deflectors (e.g., refer to Japanese Patent Application Laid-open (JP-A) No. 2014-112639).

BRIEF SUMMARY OF THE INVENTION

According to one aspect of the present invention, a blanking deflector includes:
a first electrode formed to be plate-like;
a second electrode configured to be electrically separated from the first electrode, and arranged such that a first space is formed between the first electrode and the second electrode; and
a third electrode configured to be electrically separated from the first electrode, and arranged such that a second space, sufficiently wider than the first space, is formed between the first electrode and the third electrode, wherein
a transmission line, in which the second and third electrodes are electrically connected at, at least, an input side and an output side, is formed by the first, second, and third electrodes,
multi-beams of a charged particle beam are made to pass through the second space between the first and third electrodes, and
the multi-beams are deflected for blanking control by a voltage signal applied from the input side to between the first electrode, and a connected group of the second and third electrodes electrically connected.

According to another aspect of the present invention, a multi charged particle beams writing apparatus includes:
an emission source configured to emit a charged particle beam;
a shaping aperture array substrate, in which a plurality of first openings are formed, configured to form multi-beams by making a region including a whole of the plurality of first openings irradiated with the charged particle beam, and making portions of the charged particle beam individually pass through a corresponding one of the plurality of first openings;
a blanking deflector including
 a first electrode formed to be plate-like,
 a second electrode configured to be electrically separated from the first electrode, and arranged such that a first space is formed between the first electrode and the second electrode, and
 a third electrode configured to be electrically separated from the first electrode, and arranged such that a second space, sufficiently wider than the first space, is formed between the first electrode and the third electrode, wherein
 a transmission line, in which the second and third electrodes are electrically connected at, at least, an input side and an output side, is formed by the first, second, and third electrodes, multi-beams of a charged particle beam are made to pass through the second space between the first and third electrodes, and the multi-beams are deflected for blanking control by a voltage signal applied from the input side to between the first electrode, and a connected group of the second and third electrodes electrically connected;

a limiting aperture substrate configured to collectively block a whole of the multi-beams having been deflected to be in a beam-OFF condition by the blanking control; and a stage configured to mount thereon a target object to be written with the multi-beams having passed through the limiting aperture substrate while being in a beam-ON condition controlled by the blanking control, wherein the blanking deflector provides deflection such that an extension of a trajectory of an electron of the multi-beams passing a center of the shaping aperture array substrate and having been deflected intersects the center of the shaping aperture array substrate.

According to yet another aspect of the present invention, a multi charged particle beams writing apparatus includes:

an emission source configured to emit a charged particle beam;

a shaping aperture array substrate, in which a plurality of first openings are formed, configured to form multi-beams by making a region including a whole of the plurality of first openings irradiated with the charged particle beam, and making portions of the charged particle beam individually pass through a corresponding one of the plurality of first openings;

a blanking deflector including
a first electrode formed to be plate-like,
a second electrode configured to be electrically separated from the first electrode, and arranged such that a first space is formed between the first electrode and the second electrode, and
a third electrode configured to be electrically separated from the first electrode, and arranged such that a second space, sufficiently wider than the first space, is formed between the first electrode and the third electrode, wherein
a transmission line, in which the second and third electrodes are electrically connected at, at least, an input side and an output side, is formed by the first, second, and third electrodes, multi-beams of a charged particle beam are made to pass through the second space between the first and third electrodes, and the multi-beams are deflected for blanking control by a voltage signal applied from the input side to between the first electrode, and a connected group of the second and third electrodes electrically connected;

a limiting aperture substrate configured to collectively block a whole of the multi-beams having been deflected to be in a beam-OFF condition by the blanking control; and a stage configured to mount thereon a target object to be written with the multi-beams having passed through the limiting aperture substrate while being in a beam-ON condition controlled by the blanking control, wherein the second space between the first and third electrodes changes depending on a beam diameter of a whole of the multi-beams.

BRIEF DESCRIPTION OF THE DRAWINGS

FIGS. 8A and 8B show a relation between the magnetic field and the transmission direction of a voltage signal according to the first embodiment;

FIGS. 25A and 25B show front and left side views of the structure of a common blanking deflector according to the ninth embodiment.

DETAILED DESCRIPTION OF THE INVENTION

Since the number of beams is large in multi-beams, the beam diameter of the entire multi-beams is extremely large compared to that of a single beam. Even if attempted to deflect the whole of multi-beams so as to repeat beam ON/OFF at high speed by using a coaxial structure deflector, for example, it is difficult to increase the size of the passage hole, through which the beam passes, up to the size of the beam diameter of the entire multi-beams. Further, for example, if attempted to perform deflection by a parallel plate type deflector, although it is possible to widen the space between two electrodes configuring the deflector up to the beam diameter of the entire multi-beams, since the space has been widened, the width dimensions of the two electrodes become too large to perform deflection so as to repeat beam ON/OFF at high speed. Therefore, a deflector of a compact structure is desired.

Hereinafter, a blanking deflector which is compact-sized and can perform, in multi-beam writing, deflection of the entire multi-beams while repeating beam ON/OFF at high speed, and a multi charged particle beam writing apparatus are described in Embodiments below.

In the Embodiments below, there will be described a configuration in which an electron beam is used as an example of a charged particle beam. The charged particle beam is not limited to the electron beam, and other charged particle beam such as an ion beam may also be used.

First Embodiment

Figure 1:
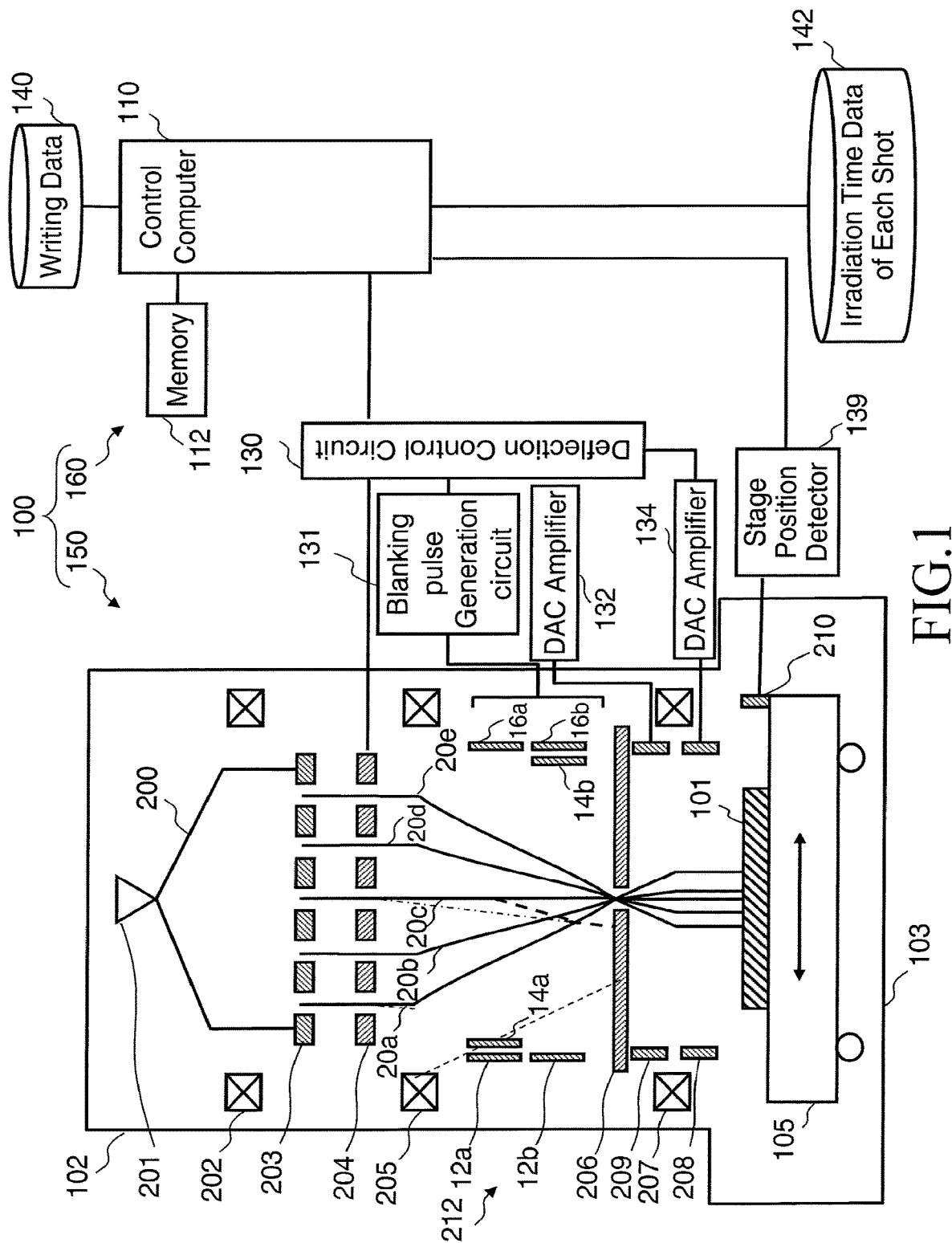
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control system circuit 160. The writing apparatus 100 is an example of a multi charged particle beam writing apparatus. The writing mechanism 150 includes an electron optical column 102 (multi electron beam column) and a writing chamber 103. In the electron optical column 102, there are arranged an electron source 201, an illumination lens 202, a shaping aperture array substrate 203 (SAA), a blanking aperture array mechanism 204, a reducing lens 205, a common blanking deflector 212, a limiting aperture substrate 206, an objective lens 207, a deflector 208, and a deflector 209. Here it is assumed that the lens field generated by the lenses 202, 205 and 207 is essentially axially symmetric with a central axis and the electron emitting point of the electron source 201 is on that central axis and that the optical axis concides with that central axis and that the center of SAA 203 is on the optical axis. In the writing chamber 103, there is arranged an XY stage 105. On the XY stage 105, a target object or "sample" 101 such as a mask blank on which resist is applied, serving as a writing target substrate, is placed when writing is performed. The target object 101 is, for example, an exposure mask used for fabricating semiconductor devices, or a semiconductor substrate (silicon wafer) for fabricating semiconductor devices. Moreover, a mirror 210 for measuring the position of the XY stage 105 is arranged on the XY stage 105.

The control system circuit 160 includes a control computer 110, a memory 112, a deflection control circuit 130, a blanking pulse generation circuit 131, a DAC (digital-analog converter) amplifier units 132 and 134, a stage position detector 139, and storage devices 140 and 142 such as magnetic disk drives. The control computer 110, the memory 112, the deflection control circuit 130, the stage position detector 139, and the storage devices 140 and 142 are connected with each other through a bus (not shown). The deflection control circuit 130 is connected to the blanking pulse generation circuit 131, the DAC amplifier units 132 and 134, and the blanking aperture array mechanism 204. Outputs of the blanking pulse generation circuit 131 are connected to the common blanking deflector 212. Outputs of the DAC amplifier unit 132 are connected to the deflector 209. Outputs of the DAC amplifier unit 134 are connected to the deflector 208. The stage position detector 139 irradiates the mirror 210 on the XY stage 105 with a laser beam, and receives a reflected light from the mirror 210. Then, the stage position detector 139 measures the position of the XY stage 105 by using information of the reflected light.

Data which is input and output to/from the control computer 110, and data being operated are stored in the memory 112 each time.

Moreover, writing data is input from the outside of the writing apparatus 100, and stored in the storage device 140. The writing data usually defines information on a plurality of figure patterns to be written. Specifically, it defines a figure code, coordinates, size, etc. for each figure pattern.

FIG. 1 shows configuration elements necessary for describing the first embodiment. It should be understood that other configuration elements generally necessary for the writing apparatus 100 may also be included therein.

Figure 2:
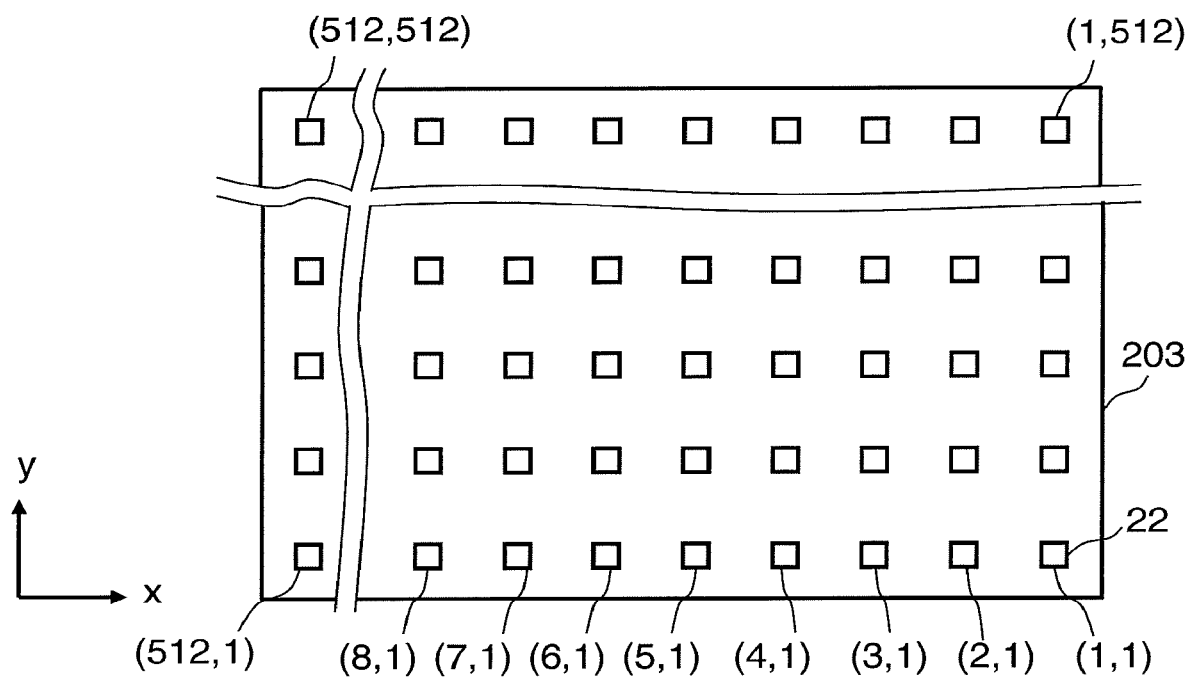
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in x direction) (p≥2, q≥2) are formed, like a matrix, at a predetermined arrangement pitch in the shaping aperture array substrate 203. In FIG. 2, for example, holes 22 of 512 (rows of holes arrayed in y direction)×512 (columns of holes arrayed in x direction) are formed. Each of the holes 22 is a quadrangle (rectangle) having the same dimension and shape. Alternatively, each of the holes 22 may be a circle with the same diameter. Multi-beams 20 are formed by making portions of an electron beam 200 individually pass through a corresponding hole of a plurality of holes 22. Shown here is the case where the holes 22 of two or more rows and columns are arranged horizontally and vertically (in x and y directions), but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged like a grid in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1)th and the (k+2)th rows which are arrayed (accumulated) in the length direction (y direction), each hole in the (k+1)th row and each hole in the (k+2)th row may be mutually displaced in the width direction (x direction) by a dimension "b", for example.

Figure 3:
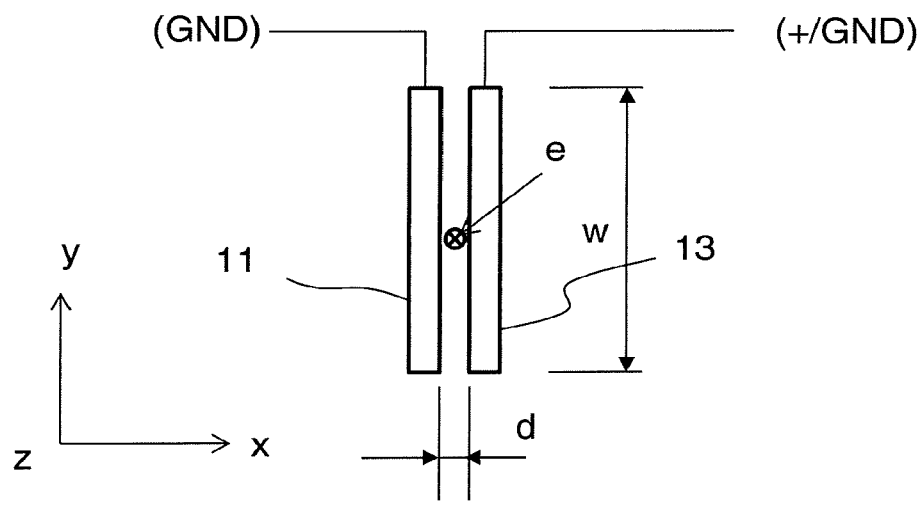
FIG. 3 is a top view showing the structure of a common blanking deflector according to a comparative example of the first embodiment.

FIG. 3 is a top view showing the structure of a common blanking deflector according to a comparative example of the first embodiment. In FIG. 3, the common blanking deflector of a transmission line system of the comparative example of the first embodiment includes two parallel plate electrodes 11 and 13, arranged with a space d therebetween, each including conductive material and having a width w. A terminating resistance (not shown) is connected to the output terminal (or "output end"). It is assumed that an electron beam travels from upper to lower, that is from the front side to the back side of FIG. 3. A ground potential is applied to the electrode 11. A potential being switched between a positive potential and a ground potential is applied to the electrode 13. The characteristic impedance Zc of the transmission line formed by the two parallel plate electrodes 11 and 13 is approximated by the following equation (1) using vacuum permeability and permittivity (dielectric constant) $\mu_0$ and $\varepsilon_0$ under the condition that the width w is sufficiently larger the space d.

$$Zc=\sqrt{(\mu_0/\varepsilon_0)}\cdot(d/w) \quad (1)$$

Here, if coefficient $k=Zc/\sqrt{(\mu_0/\varepsilon_0)}$, when the impedance Zc is uniquely set, the space d and the width w need to maintain a constant proportional relation. Therefore, since the space d can be made small when the diameter of the electron beam is small, it is possible to keep the width w small. Accordingly, for example, single beam deflection can be performed by using the two parallel electrodes 11 and 13. However, since the beam diameter of the entire multi-beams 20 is extremely large compared to that of a single beam, if the space d is widened in accordance with the largeness of the beam diameter, the size of the width w needs to be dramatically increased. Therefore, it is desired to make the electrode compact. Then, according to the first embodiment, by arranging three electrodes as described below, a deflector is configured which can collectively deflect the whole of the multi-beams 20 while keeping the size of the width w small.

Figure 4:
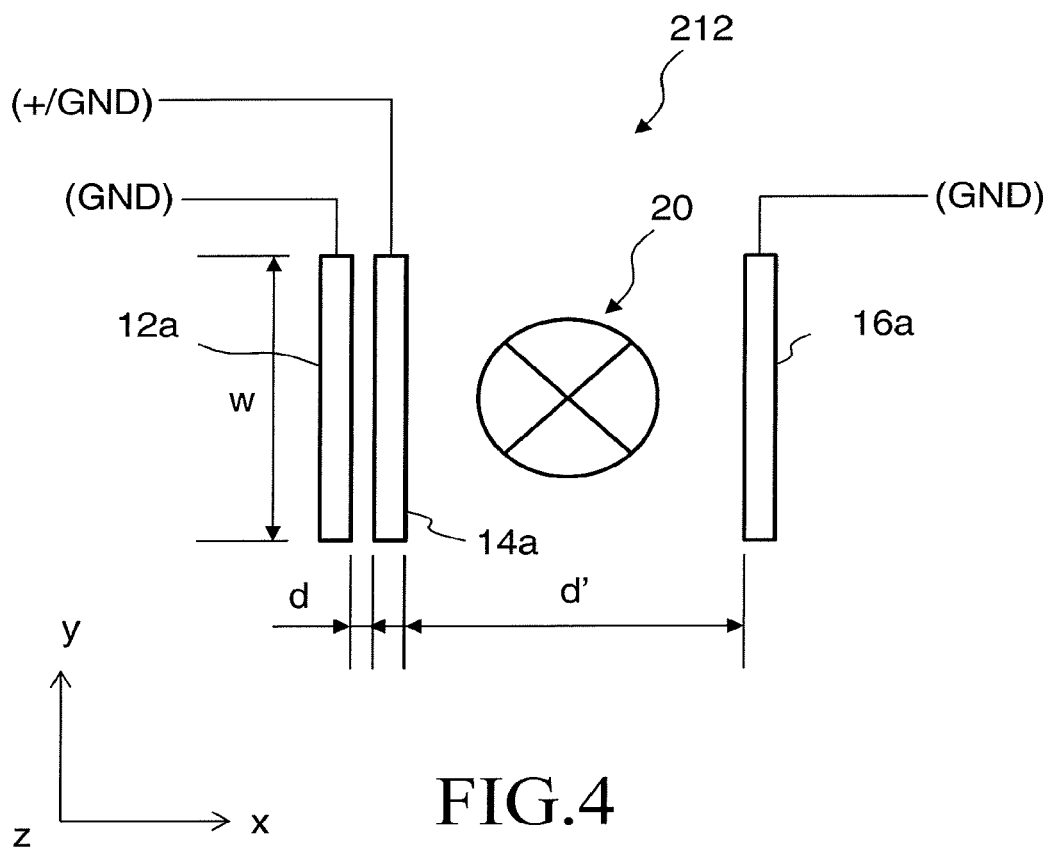
FIG. 4 is a top view showing a structure of a common blanking deflector according to the first embodiment.

FIG. 4 is a top view showing a structure of a common blanking deflector according to the first embodiment. It is assumed that an electron beam (multi-beams 20) travels from upper to lower, that is from the front side to the back side of FIG. 4. As described above, in order to keep the size of the width w small, it is necessary to reduce the space d. Then, the common blanking deflector 212 according to the first embodiment has the following structure as shown in FIG. 4. There are arranged an electrode 14 (first electrode) and an electrode 12 (second electrode) electrically separated from each other, with the space d (first space) therebetween maintaining the proportional relation described above, each formed of a parallel plate including conductive material and having a width w, and further arranged an electrode 16 which is electrically separated from the electrode 14 (first electrode) and formed of a parallel plate including conductive material. The electrode 16 (third electrode) is arranged at the position facing a parallel plane (surface) of the electrode 14 which is opposite to the other parallel plane (surface) facing the electrode 12. As shown in FIG. 4, the space d' (second space) between the electrodes 14 and 16 is arranged to be sufficiently wider than the space d between the electrodes 12 and 14. The space d' is formed having a larger size than the beam diameter of the entire multi-beams 20. A ground potential is applied to the electrodes 12 and 16. A potential being switched between a positive potential and a ground potential is applied to the electrode 14. When a positive potential is applied to the electrode 14, an electric field E going to the electrode 12 from the electrode 14 occurs between the two parallel plate electrodes 12 and 14 with the space d therebetween. The electric field E is similarly formed between the electrodes 14 and 16. Therefore, as long as the equation (1) described above is satisfied, the multi-beams 20 can be deflected between the electrodes 14 and 16. Accordingly, it is possible, keeping the size of the width w small, to collectively deflect the entire multi-beams 20 having a large beam diameter. In that case, the transmission line is formed by the three electrodes 12, 14, and 16. Although not shown, in this transmission line, the electrodes 12 and 16 are electrically connected with each other at least at the input side and the output side. Moreover, if a conductor exists in the vicinity, it affects transmission of signals. However, here, it is assumed that the influence can be ignored. The characteristic impedance of this transmission line is substantially determined by the size (for example, width w) and the distance (space d) of the electrodes 12 and 14. However, strictly, the value of the characteristic impedance varies a little depending on the existence of the electrode 16. The more accurate value of the characteristic impedance of the transmission line formed by the three electrodes 12, 14, and 16 can be numerically obtained if the sectional shapes of the three electrodes 12, 14, and 16 are determined.

Figures 5A, 5B:
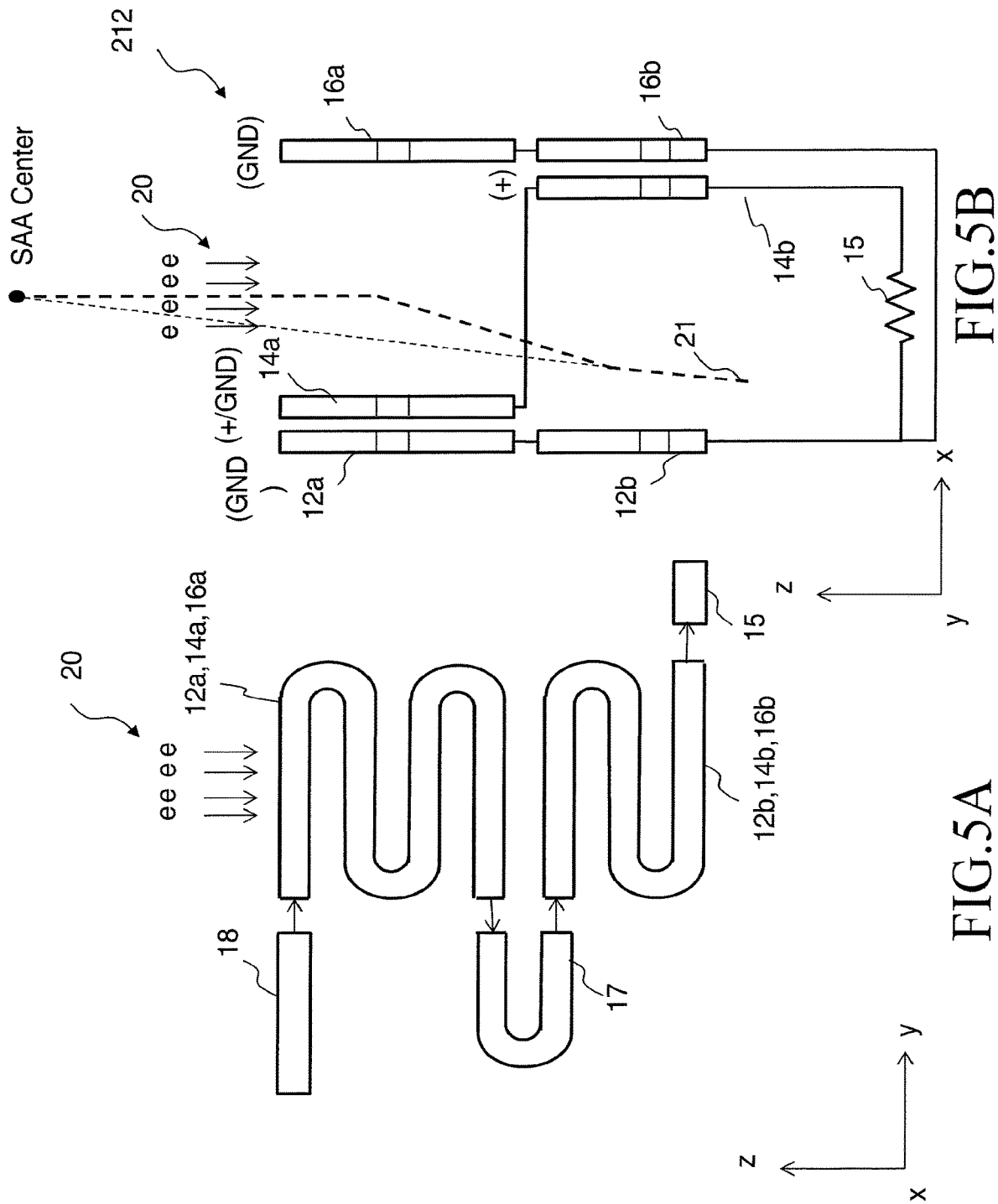
FIGS. 5A and 5B show front and left side views of the structure of a common blanking deflector according to the first embodiment.

FIGS. 5A and 5B show front and left side views of the structure of a common blanking deflector according to the first embodiment. The structure of this example is configured by a deflector composed of two deflectors, each having an input terminal (or "input end") and an output terminal, connected by a coaxial cable. FIG. 5A shows the left side view of the common blanking deflector 212 according to the first embodiment. FIG. 5B shows the front view of the common blanking deflector 212 according to the first embodiment. The common blanking deflector 212 is configured by a two-stage deflector. The former stage (former-stage deflector) is configured by three parallel plate electrodes 12a, 14a, and 16a. The latter stage (latter-stage deflector) is configured by three parallel plate electrodes 12b, 14b, and 16b. As shown in FIG. 5B, at the former stage, the electrodes 12a and 14a are arranged with the narrow space d therebetween nearly satisfying the equation (1) described above, and the electrodes 14a and 16a are arranged with the space d' therebetween larger than the beam diameter of the entire multi-beams 20. At the latter stage, the electrodes 12b and 14b are arranged with the space d' therebetween larger than the beam diameter of the entire multi-beams 20, and the electrodes 14b and 16b are arranged with the narrow space d therebetween nearly satisfying the equation (1) described above. The electrodes 12a and 12b used as counter electrodes (ground electrode) are formed each having the same width w (or width wider than w), and arranged at the same position with respect to the direction (x-y direction) orthogonal to the optical axis (z axis) of the multi-beams 20. Similarly, the electrodes 16a and 16b used as counter electrodes (ground electrode) are formed each having the same width w (or width wider than w), and arranged at the same position with respect to the directions (x and y directions) orthogonal to the optical axis (z axis) of the multi-beams 20. On the other hand, the electrodes 14a and 14b used as control electrodes are formed each having the same width w, and arranged at different positions with respect to the x direction, for example, in the directions (x and y directions) orthogonal to the optical axis (z axis) of the multi-beams 20 in order to keep the width w between the counter electrodes (ground electrode) which are different in the former stage and in the latter stage. The electrodes 14a and 14b are arranged at the same position with respect to the y direction.

The electrodes 12a and 12b are electrically connected (conducted). The electrodes 14a and 14b are electrically connected (conducted). The electrodes 16a and 16b are electrically connected (conducted). To the electrodes 14a and 14b used as control electrodes, a positive potential (first electric potential) and a ground potential (second electric potential) are applied in a switchable manner from the input side. To the electrodes 12a, 12b, 16a, and 16b used as counter electrodes (ground electrode), a ground potential is applied from the input side.

At the former stage of the common blanking deflector 212, the multi-beams 20 pass between the electrodes 14a and 16a. In the state where a positive potential (first electric potential) has been applied to the electrode 14a, since an electric potential difference is generated between the electrodes 14a and 16a, the multi-beams are deflected to the electrode 14a side. In the state where a ground potential (second electric potential) has been applied to the electrode 14a, since no electric potential difference is generated between the electrodes 14a and 16a, the multi-beams go straight without being deflected. At the latter stage of the common blanking deflector 212, the multi-beams 20 pass between the electrodes 12b and 14b. In the state where a positive potential has been applied to the electrode 14b, since an electric potential difference is generated between the electrodes 12b and 14b, the multi-beams are deflected to the electrode 14b side. In the state where a ground potential has been applied to the electrode 14b, since no electric potential difference is generated between the electrodes 12b and 14b, the multi-beams go straight without being deflected. In FIG. 5B, since the electrodes 14a and 14b are electrically connected (conducted), when a positive potential has been applied to the electrodes 14a and 14b, the trajectory of an electron of multi-beams 20 passing through the center of SAA 203 are once deflected outward from the optical axis at the former stage of the common blanking deflector 212, and then, the trajectory of the electron of the multi-beams 20 described above are swung back by deflection to the optical axis side at the latter stage of the common blanking deflector 212. In that case, the common blanking deflector 212 (blanking deflector) provides deflection so that the height position where the extension of a trajectory 21 of the deflected electron of multi-beams 20 intersects the optical axis may be the central height position of the shaping aperture array substrate 203 (SAA). In the example of FIG. 5B, the deflection amount is adjusted so that the height position, where the extension of the trajectory 21 of the electron of the multi-beams 20 (abbreviated below as "the trajectory 21 of the multi-beams 20") having been swung back by deflection at the former stage of the common blanking deflector 212 intersects the optical axis, may be the central height position of the shaping aperture array substrate 203 (SAA). Since a multi-beam image is formed by the shaping aperture array substrate 203, by performing beam deflection as if the central height position of the shaping aperture array substrate 203 were a deflection center, it becomes possible to eliminate (or reduce) shifting (deviation) of the image at the time of the blanking operation on the surface of the target object 101 which is arranged at a plane conjugate to the shaping aperture array substrate 203. Since the same electric potential is applied to the electrodes 14a and 14b, as long as the deflection distance (z direction) is the same, the deflection amounts of the electrodes 14a and 14b are the same. Therefore, adjustment of the deflection amount of each stage may be performed by adjusting the length in the z direction of the electrode 14a at the former stage of the common blanking deflector 212, and the length in the z direction of the electrode 14b at the latter stage, for example.

When there is magnetic or electric fields of the optical elements like a lens or an alignment deflector between the shaping aperture array and the common blanking deflector, the straight extension of a trajectory may not be adequate since the electron trajectory is not straight between the shaping aperture array and the common blanking deflector and, strictly speaking, the "coincidence condition" may not be satisfied and the aperture image at the target plane moves to some extent. If this movement is not allowed, the deflection angle and the azimuthal deflection direction of the latter stage deflector can be determined so that the "coincidence condition" is satisfied. The terms "an extension of a trajectory of an electron of the multi-beams, which passes the center of the shaping aperture array substrate at the aperture array's central height position and having been deflected intersects the center of the shaping aperture array substrate" is used to include this case in which the deflection angle and the azimuthal deflection direction of the latter stage deflector is adjusted so that the "coincidence condition" is satisfied.

When "coincidence condition" is satisfied, the movements of the other electrons of the multi beam 20 which passes the shaping aperture array at other position than the center when the blanking deflector is activated can be also small.

Therefore, in a paraxial approximation, the "post-deflected trajectory" of an electron of the multi-beams (electron P), which passes the center of the shaping aperture array substrate at the aperture array's central height and having been deflected, coincides with a trajectory of a certain electron which passes the center of the shaping aperture array substrate at the aperture array's central height, but in the direction different from the electron P, and progresses without deflection by the blanking deflector. The applicant calls this condition "coincidence condition". Here, "post-deflected" trajectory means the part of the trajectory of an electron below the blanking deflector. "The center of the shaping aperture array" is defined as the position on the shaping aperture array which the center of the multi beams irradiates. When the shape of the electron beam distribution of the multi beams is a circle or a regular polygon, the center of the multi beams is usually defined as the center of that circle or that regular polygon, but some offset can be made. If the shape is not such regular one, the user can define the most important point as the center. It is assumed that there exists an aperture in the shaping aperture array where the center of the multi beams irradiates. If there is not a real aperture at the center of the multi beams, it is assumed there is a virtual aperture whose position is at the center of the multi beams and that electron P starts from the virtual aperture at the central height. Or the position of a real aperture nearest to the center of the multi beams can be defined as the center of the shaping aperture array.

It is above described that the height of the intersection position is at the central height of SAA as "the height of the SAA". However, the intersection height can be different and the preferred height is within the SAA thickness. For example, the height of the top surface, or the height of the bottom surface can be chosen. When the reduction optics is adopted for the electron optical column 102 and SAA is thin, the impact of these small difference of this intersection height is allowable. Therefore, when "the height of the SAA" is cited, it means a height within the SAA thickness.

Although, in the example described above, the deflection amount is adjusted such that the height position where the extension of the trajectory 21 of the multi-beams 20 having been swung back by deflection intersects the optical axis is the central height position of the shaping aperture array substrate 203 (SAA), it is not limited thereto. For example, the deflection amount may be adjusted such that the height position where the extension of the trajectory 21 of the multi-beams 20 having been swung back by deflection intersects the optical axis is the central height position of the blanking aperture array mechanism 204. Since the distance between the SAA 203 and the blanking aperture array mechanism 204 is small, the movement at the target plane is acceptably small.

In the blanking control, potential switching to the electrodes 14a and 14b used as control electrodes is repeated at high speed. Therefore, if reflection of an incident signal occurs, it becomes difficult to provide high speed response. This makes it difficult to perform blanking control which is required to respond at high speed. Then, according to the first embodiment, the output side of the electrode 14b used as a control electrode, and a connected group of the output side of the electrode 12b used as a counter electrode (ground electrode) and the output side of the electrode 16b used as a counter electrode (ground electrode) are connected through a terminating resistance 15. By inputting a blanking signal (positive electric potential or ground potential) from the input side of the electrode 14a used as a control electrode, the signal is transmitted in the transmission line formed by three electrodes 12a, 14a, and 16a and three electrodes 12b, 14b, and 16b, and then, the signal is absorbed by the terminating resistance. Needless to say, the surfaces at the space d' side of the electrodes 14a and 14b are opposite (inverse) in the former stage and in the latter stage of the common blanking deflector 212.

As shown in FIG. 5A, a coaxial cable 18, having a characteristic impedance substantially the same as that of the transmission line formed by the plate-type electrodes 14a and 14b used as control electrodes, the electrodes 12a and 12b and the electrodes 16a and 16b used as counter electrodes (ground electrodes), is connected to the input side of the transmission line. A potential being switched between a positive potential and a ground potential described above is applied to the electrodes 14a and 14b from the coaxial cable 18. In other words, voltage signals are applied between the electrodes 14a/14b, and a ground group of electrodes 12a/12b and 16a/16b from the input side of the transmission line. By applied with this voltage signal, the multi-beams 20 are deflected for blanking control.

The terminating resistance 15 is configured such that it has a characteristic impedance substantially the same as that of the transmission line formed by the plate-type electrodes 14a and 14b used as control electrodes, electrodes 12a and 12b and electrodes 16a and 16b used as counter electrodes (ground electrodes). In other words, the terminating resistance 15 having a characteristic impedance substantially the same as that of the transmission line formed by the electrodes 14a and 14b, the electrodes 12a and 12b, and the electrodes 16a and 16b is connected to the output side of the transmission line. In other words, the terminating resistance 15 is arranged in the line connecting the plate-type electrode 14b used as a control electrode, and the electrodes 12b and 16b used as counter electrodes (ground electrodes). Further, a coaxial cable 17 which has substantially the same characteristic impedance connects between the former stage and the latter stage of the common blanking deflector 212. By using the characteristic impedances each having the same impedance as described above, signal reflection can be avoided (or reduced). Therefore, high speed response can be improved.

Preferably, as shown in FIG. 5A, each of the electrodes 12, 14, and 16 is formed of a plate-like member extending in a zigzag manner while folding back by 180 degrees, for example.

Figure 6:
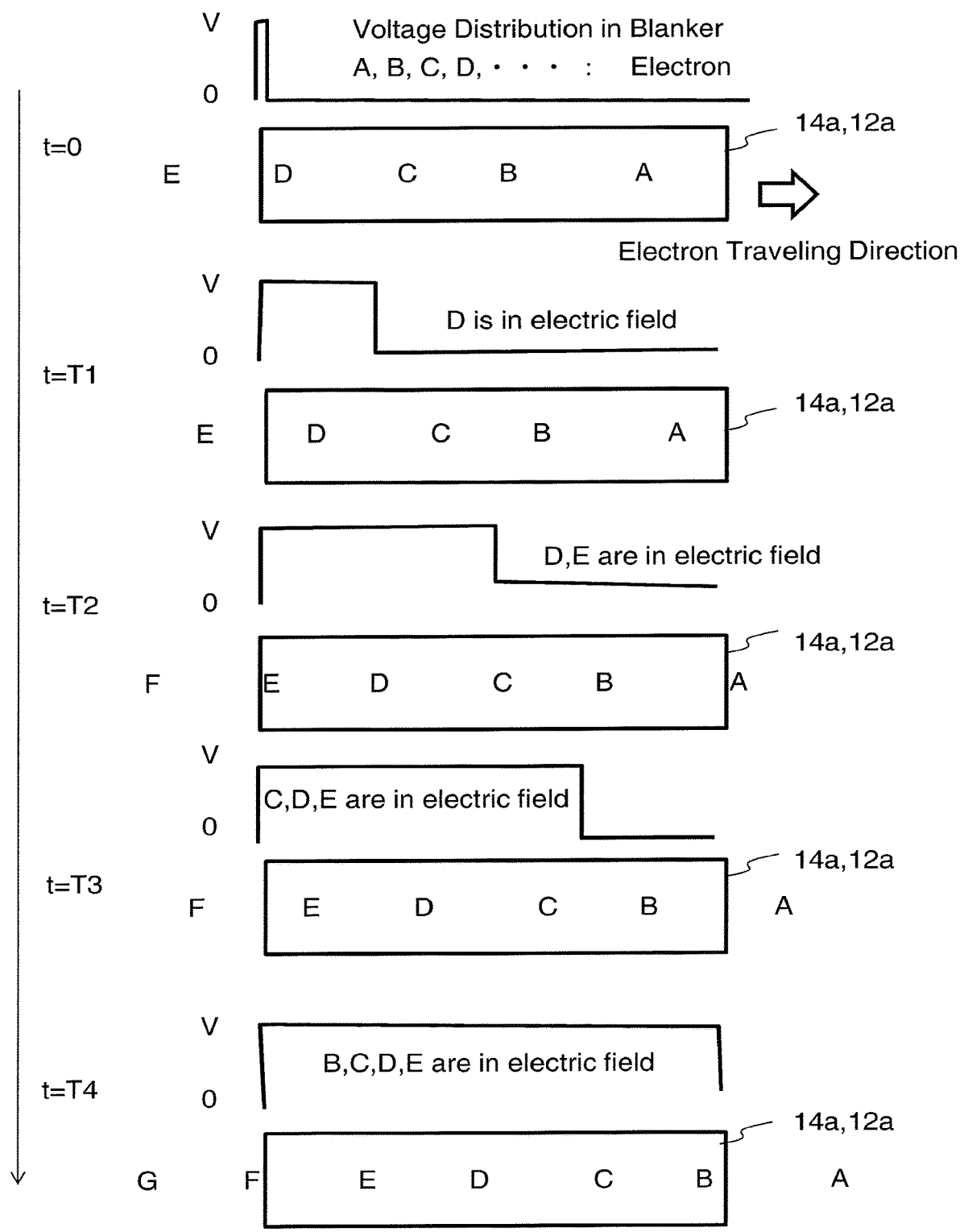
FIG. 6 shows a relation in time series between a traveling wave of an electric potential traveling in a common blanking deflector and a velocity of an electron in an electron beam according to the first embodiment.

FIG. 6 shows a relation in time series between a traveling wave of an electric potential traveling in a common blanking deflector and a velocity of an electron in an electron beam according to the first embodiment.

Figure 7:
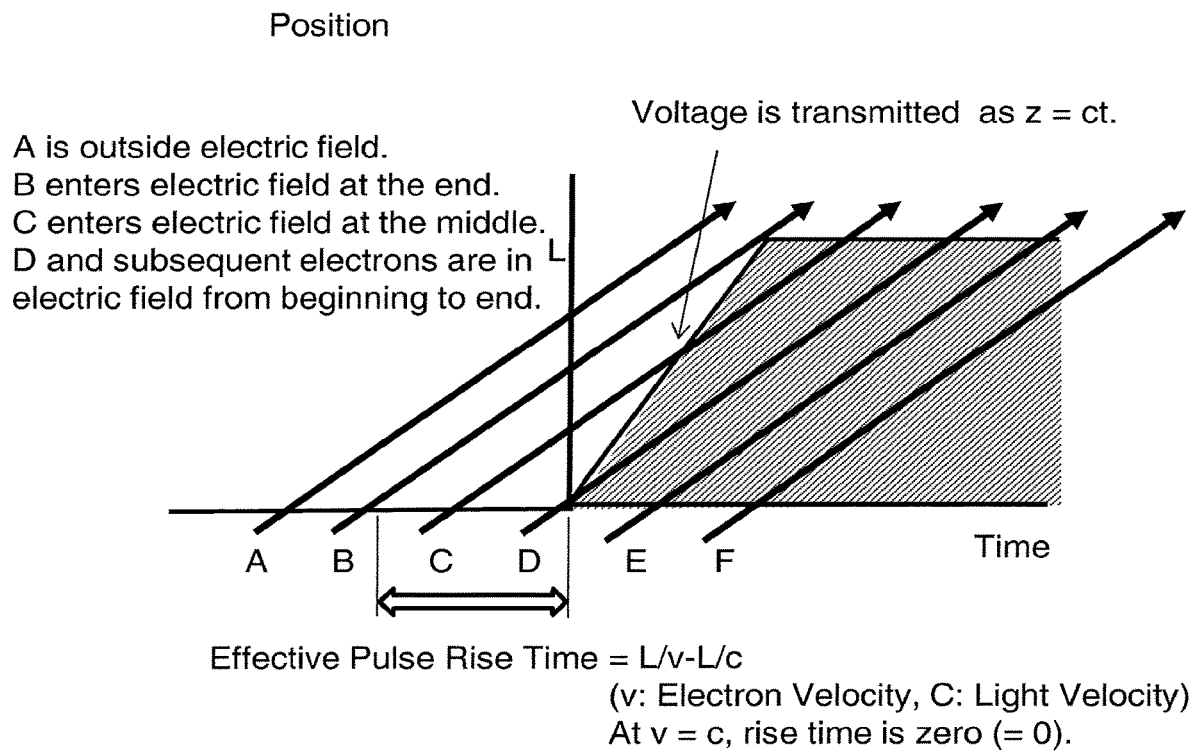
FIG. 7 is a graph chart showing a relation between a traveling wave of an electric potential traveling in a common blanking deflector and a velocity of an electron in an electron beam according to the first embodiment.

FIG. 7 is a graph chart showing a relation between a traveling wave of an electric potential traveling in a common blanking deflector and a velocity of an electron in an electron beam according to the first embodiment. FIGS. 6 and 7 show changes along with the passage of time indicated in a voltage distribution of the electrode 14a used as a control electrode, and changes of electron transfer in the multi-beams 20 passing between the electrodes 14a and 16a. In FIGS. 6 and 7, the time at which applying a positive potential to the electrode 14a is started is defined as t=0.

At the time t=0, the multi-beams 20 enter between the electrodes 14a and 16a from the traveling direction front side and in order of the electrons from A to D, and they are still passing between the electrodes 14a and 16a with keeping the electron order. Thus, at this time t=0, none of the electrons A to D has been affected by the electric field.

At the time t=T1, although the electrons A to D travel a little, they are still passing between the electrodes 14 and 16 with keeping the order of the electrons from A to D. At this time t=T1, the electron D is affected by the electric field.

At the time t=T2, the electron A travels out from between the electrodes 14 and 16, and instead, the electron E enters between the electrodes 14 and 16, and the electrons B to E are passing between the electrodes 14 and 16 with in the order of the electrons from B to E. At this time t=T2, the electrons D and E are affected by the electric field.

At the time t=T3, although the electrons B to E travel a little, they are still passing between the electrodes 14 and 16 with keeping the order of the electrons from B to E. At this time t=T3, the electrons C, D, and E are affected by the electric field.

At the time t=T4, although the electrons B to E further travel a little, they are still passing between the electrodes 14 and 16 with keeping the order of the electrons from B to E. At this time t=T4, the electrons B to E are affected by the electric field.

In the examples of FIGS. 6 and 7, as described above, the electron A passes between the electrodes 14a and 16a (common blanking deflector 212) without being affected by the electric field. The electron B enters the electric field, in the vicinity of the end of the output side between the electrodes 14a and 16a (common blanking deflector 212). The electron C enters the electric field, in the middle of the beam path between the electrodes 14a and 16a (common blanking deflector 212). The electron D and subsequent electrons are in the electric field from the beginning to the end of the beam path between the electrodes 14a and 16a (common blanking deflector 212). Thus, since the degree (extent) of electric field influence on each electron is different, the deflection amount varies depending on the electron. Assuming that the length of the electrode 14a in the traveling direction (−z direction) of the multi-beams 20 is L, an effective pulse rise time t' of a blanking control signal (positive electric potential) can be defined by the following equation (2) using an electron velocity v and a light velocity c.

$$t' = L/v - L/c \quad (2)$$

This equation indicates that the difference between the electron velocity v and the light velocity c delays the effective pulse rise time. By the configuration as shown in FIGS. 5A and 5B, it is possible to make the effective transmission velocity c' of the signal in a traveling direction of an electron slower than the light velocity c in order to be approximately equal to the electron velocity v. This condition is equivalent to replacing the light velocity c with c' in the above equation (2) in order to be equal to the electron velocity v. In such a case, since delay of an effective pulse rise time can be avoided.

FIGS. 8A and 8B show a relation between the magnetic field and the transmission direction of a voltage signal according to the first embodiment. FIG. 8A shows a relation between the magnetic field and the transmission direction of a voltage signal in the structure where the electrodes 12, 14, and 16 extend in the traveling direction of the multi-beams 20. In the structure shown in FIG. 8A, a magnetic field is generated in the direction always orthogonal to the traveling direction (beam trajectory) of the multi-beams 20. Therefore, the multi-beams 20 are affected by the magnetic field, and receive force in the direction orthogonal to the optical axis. Accordingly, it may shift from the optical axis also by the magnetic field. On the other hand, FIG. 8B shows a relation between the magnetic field and the transmission direction of a voltage signal in the structure where the electrodes 12, 14, and 16 extend in the direction orthogonal to the traveling direction of the multi-beams 20. In the structure shown in FIG. 8B, a magnetic field is generated in the same or opposite direction with respect to the traveling direction of the multi-beams 20. Therefore, it is possible for the multi-beams 20 not to receive force orthogonal to the optical axis from the magnetic field. Thus, the multi-beams 20 can avoid shifting from the optical axis. Therefore, it is more preferable for each of the electrodes 12, 14, and 16 to extend in a zigzag manner as shown in FIG. 5A. However, according to the first embodiment, the structure in which the electrodes 12, 14, and 16 extend in the traveling direction of the multi-beams 20 is not excluded.

Figure 9:
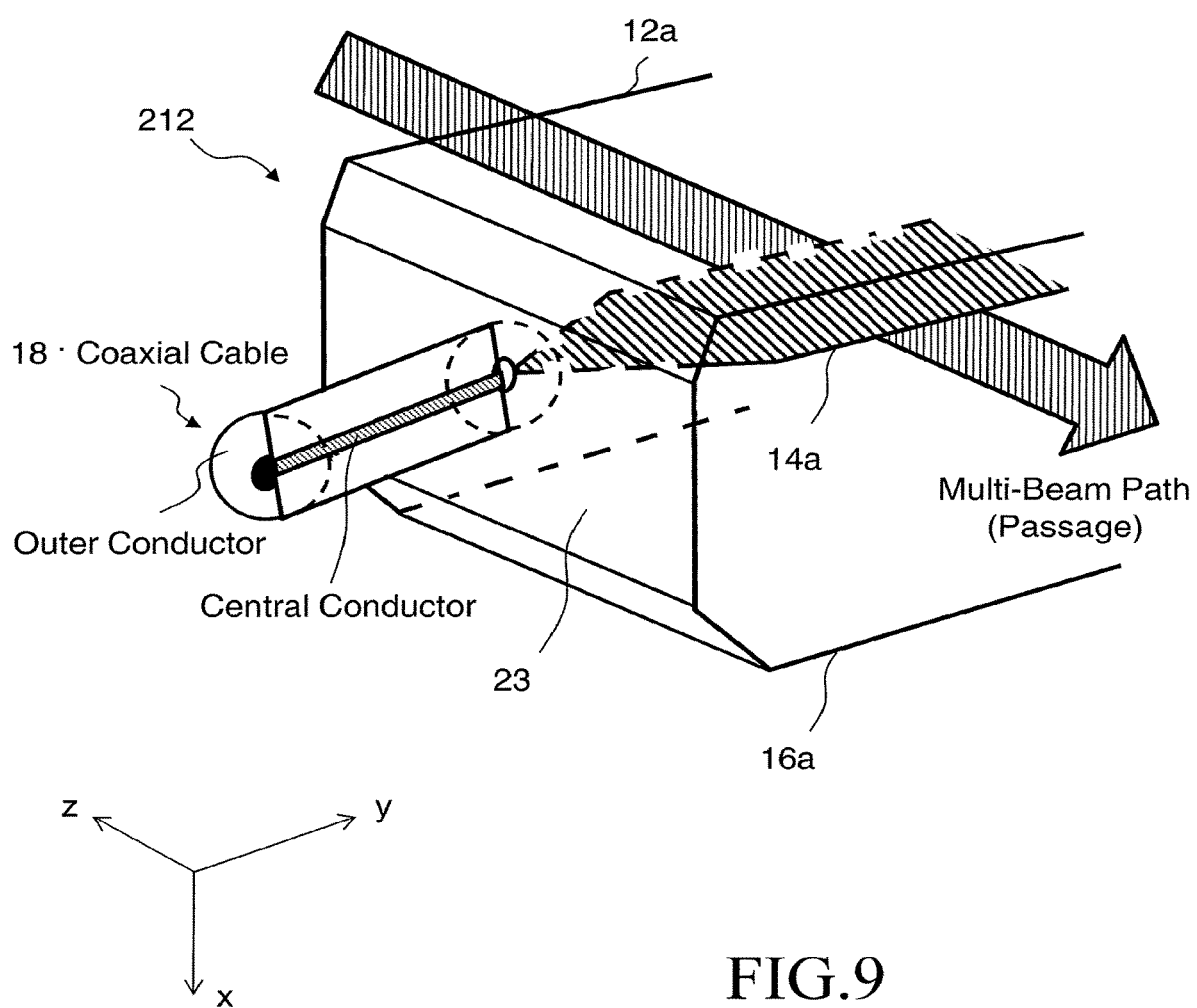
FIG. 9 shows an example of connection between three electrodes and a coaxial cable according to the first embodiment.

FIG. 9 shows an example of connection between three electrodes and a coaxial cable according to the first embodiment. FIG. 9 shows the input side of a deflection signal at the former stage of the common blanking deflector 212. The electrodes 12a and 16a on both the sides, used as counter electrodes (ground electrode), are connected by a conductive plate 23 at the input side terminal. A through-hole of the size through which the central conductor of the coaxial cable 18 can pass is formed in the conductive plate 23. The central conductor of the coaxial cable 18 passes through this through-hole, and is connected to the input side terminal of the electrode 14a used as a control electrode. On the other hand, the outer conductor of the coaxial cable 18 is connected to the input side terminals of the electrodes 12a and 16a through the conductive plate 23. As shown in FIG. 5A, the input side terminals of the electrodes 12, 14, and 16 are in the direction orthogonal to the traveling direction of the multi-beams 20. Therefore, a blanking deflection signal is input to the common blanking deflector 212 from the direction approximately orthogonal to the traveling direction (beam trajectory) of the multi-beams 20. Moreover, it is possible to configure not to interfere with the beam trajectory even though connected by the conductive plate 23.

Further, the electrodes 12b and 16b on both the sides, used as counter electrodes (ground electrode), are also connected by a conductive plate (not shown) at the output side terminal. Also in this situation, as shown in FIG. 5A, the input side terminals of the electrodes 12, 14, and 16 are in the direction orthogonal to the traveling direction of the multi-beams 20. Therefore, even though the output side terminals of the electrodes 12b and 16b are connected by the conductive plate at the output side, it is possible to configure not to interfere with the beam trajectory.

Figure 10:
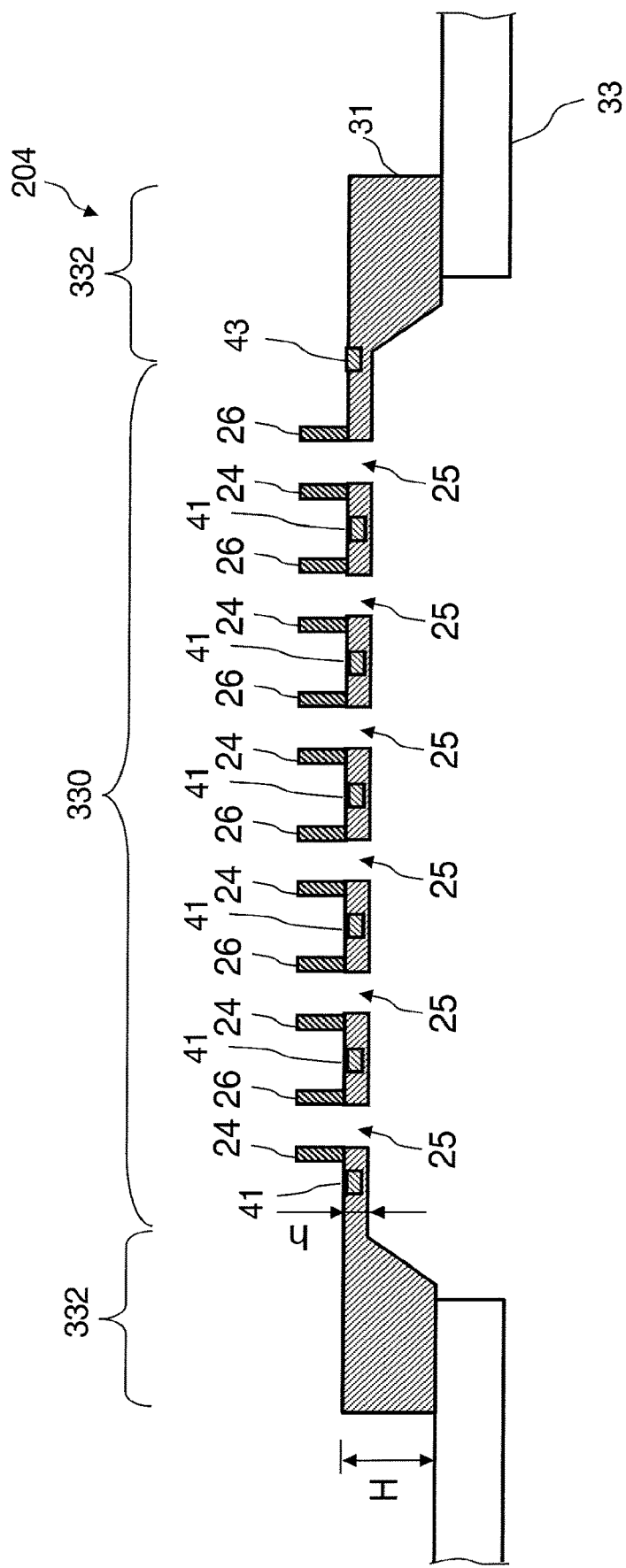
FIG. 10 is a sectional view showing a configuration of a blanking aperture array mechanism according to the first embodiment.

FIG. 10 is a sectional view showing a configuration of a blanking aperture array mechanism according to the first embodiment.

Figure 11:
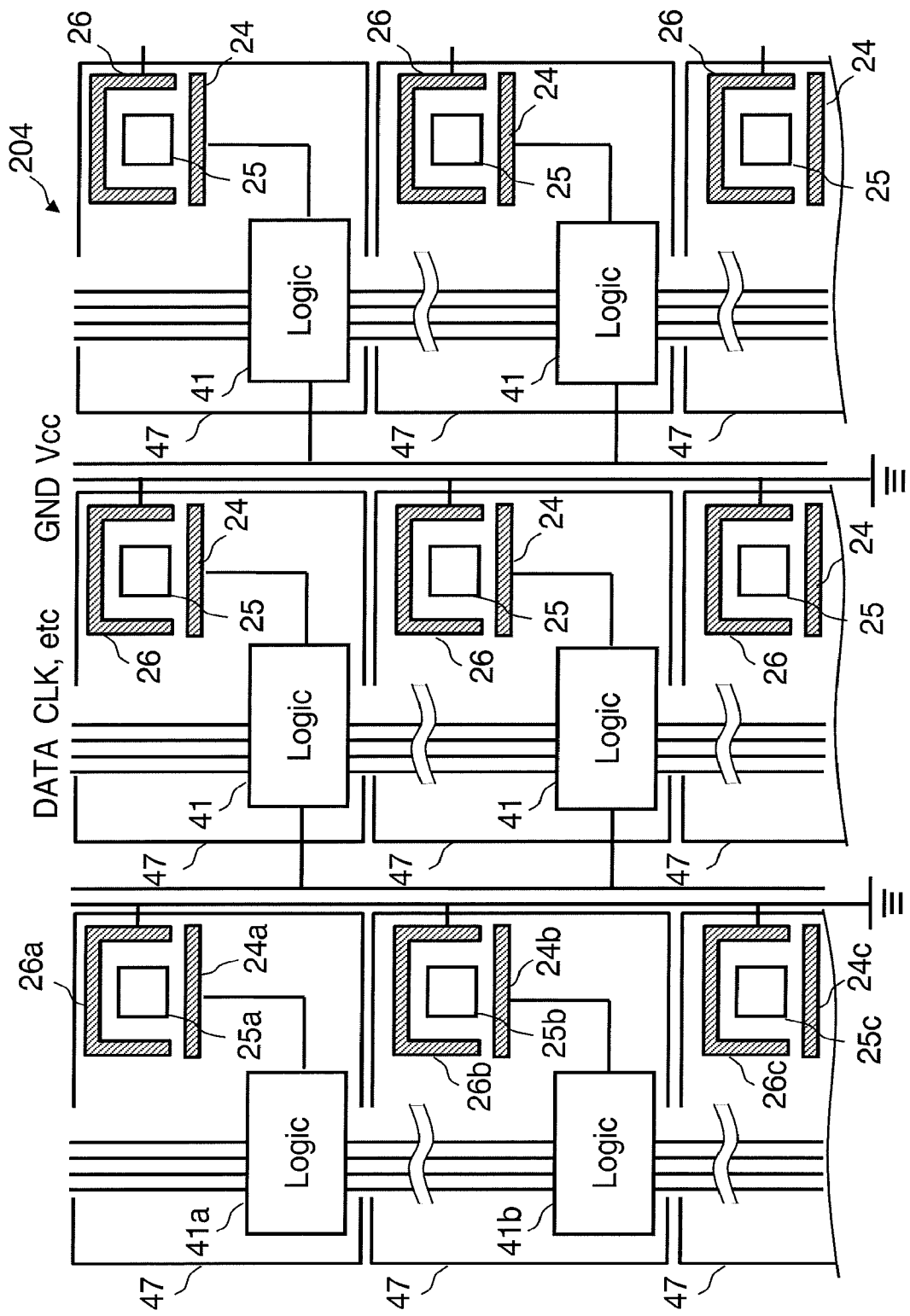
FIG. 11 is a top view conceptual diagram showing a portion of the structure in a membrane region of a blanking aperture array mechanism according to the first embodiment.

FIG. 11 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 10 is not in accordance with that of FIG. 11. With regard to the structure of the blanking aperture array mechanism 204, as shown in FIG. 10, a semiconductor substrate 31 made of silicon, etc. is placed on a support table 33. The central part of the substrate 31 is shaved from the back side, and made into a membrane region 330 (first region) having a thin film thickness h. The circumference surrounding the membrane region 330 is a circumferential region 332 (second region) having a thick film thickness H. The upper surface of the membrane region 330 and the upper surface of the circumferential region 332 are formed to be flush or substantially flush in height with each other. At the back side of the circumferential region 332, the substrate 31 is supported on the support table 33. The central part of the support table 33 is open, and the membrane region 330 is located at this opening region.

In the membrane region 330, passage holes 25 (openings) through each of which a corresponding one of multi-beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multi-beams passes. Moreover, in the membrane region 330 of the substrate 31, there are arranged a plurality of electrode pairs each composed of two electrodes being opposite each other with respect to a corresponding one of a plurality of passage holes 25. Specifically, in the membrane region 330, as shown in FIGS. 10 and 11, each pair (blanker: blanking deflector) of the control electrode 24 and the counter electrode 26 for blanking deflection is arranged close to a corresponding passage hole 25 in a manner such that the electrodes 24 and 26 are opposite each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 11, n-bit (e.g., 10-bit) parallel lines for control signals are connected to each control circuit 41. In addition to the n-bit parallel lines for controlling signals, lines for a clock signal, a read signal, a shot signal, power supply, and the like are connected to each control circuit 41.

Alternatively, a part of the parallel lines may be used as the lines for a clock signal, a read signal, a shot signal, power supply, and the like. An individual blanking mechanism 47 composed of the control electrode 24, the counter electrode 26, and the control circuit 41 is configured for each of the multi-beams. In the example of FIG. 10, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped, for example, per row or per column, and the control circuits 41 in each group are connected in series as shown in FIG. 11. Then, the pad 43 arranged for each group sends a signal to the control circuits 41 in the group concerned. Specifically, a shift register (not shown) is arranged in each control circuit 41, and for example, shift registers in the control circuits 41 for beams in the same row in p×q multiple beams, for example, are connected in series. For example, control signals for beams in the same row in the p×q multiple beams are transmitted in series, and, for example, a control signal for each beam is stored in a corresponding control circuit 41 by p clock signals totally.

Figure 12:
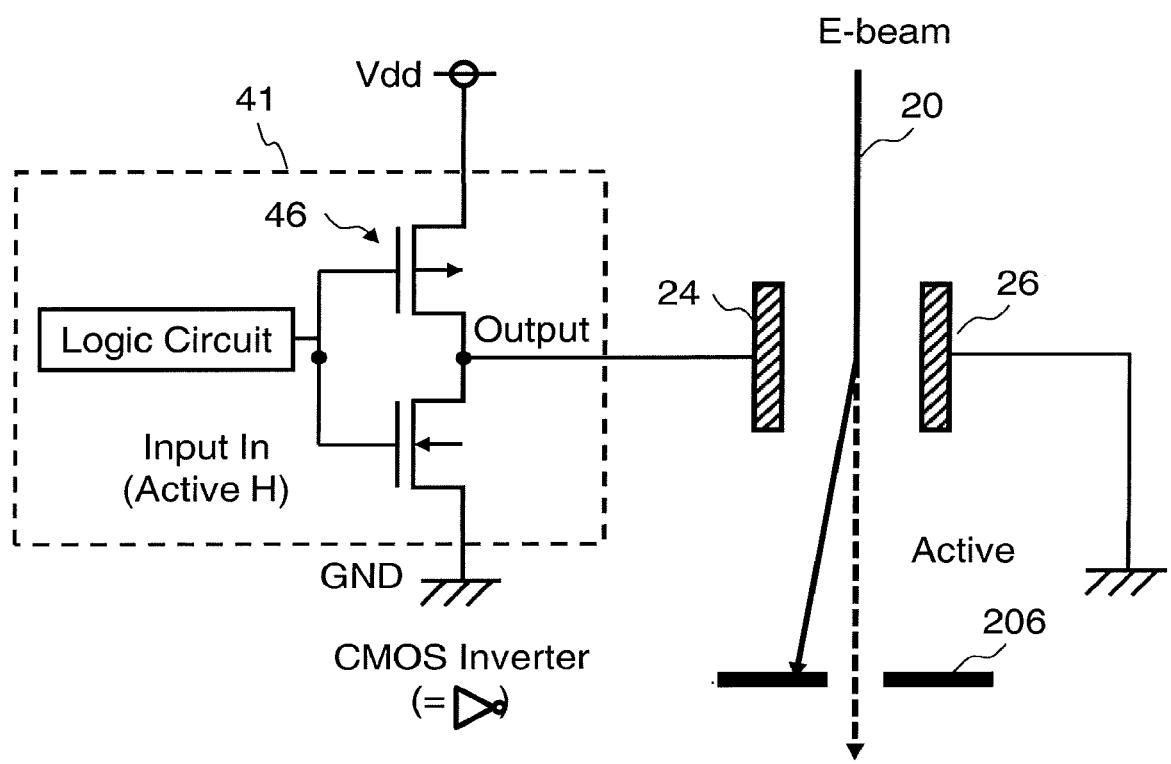
FIG. 12 shows an example of an individual blanking mechanism according to the first embodiment.

FIG. 12 shows an example of an individual blanking mechanism according to the first embodiment. As shown in FIG. 12, an amplifier 46 (an example of a switching circuit) is arranged in the control circuit 41. In the case of FIG. 12, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that the control electrode 24 and the corresponding counter electrode 26 are opposite each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is performed by this deflection. Specifically, a pair of the control electrode 24 and the counter electrode 26 individually provides blanking deflection of a corresponding beam of multi-beams by an electric potential switchable by the CMOS inverter circuit which serves as a corresponding switching circuit. Thus, each of a plurality of blankers performs blanking deflection of a corresponding beam in the multi-beams having passed through a plurality of holes 22 (openings) in the shaping aperture array substrate 203.

Figure 13:
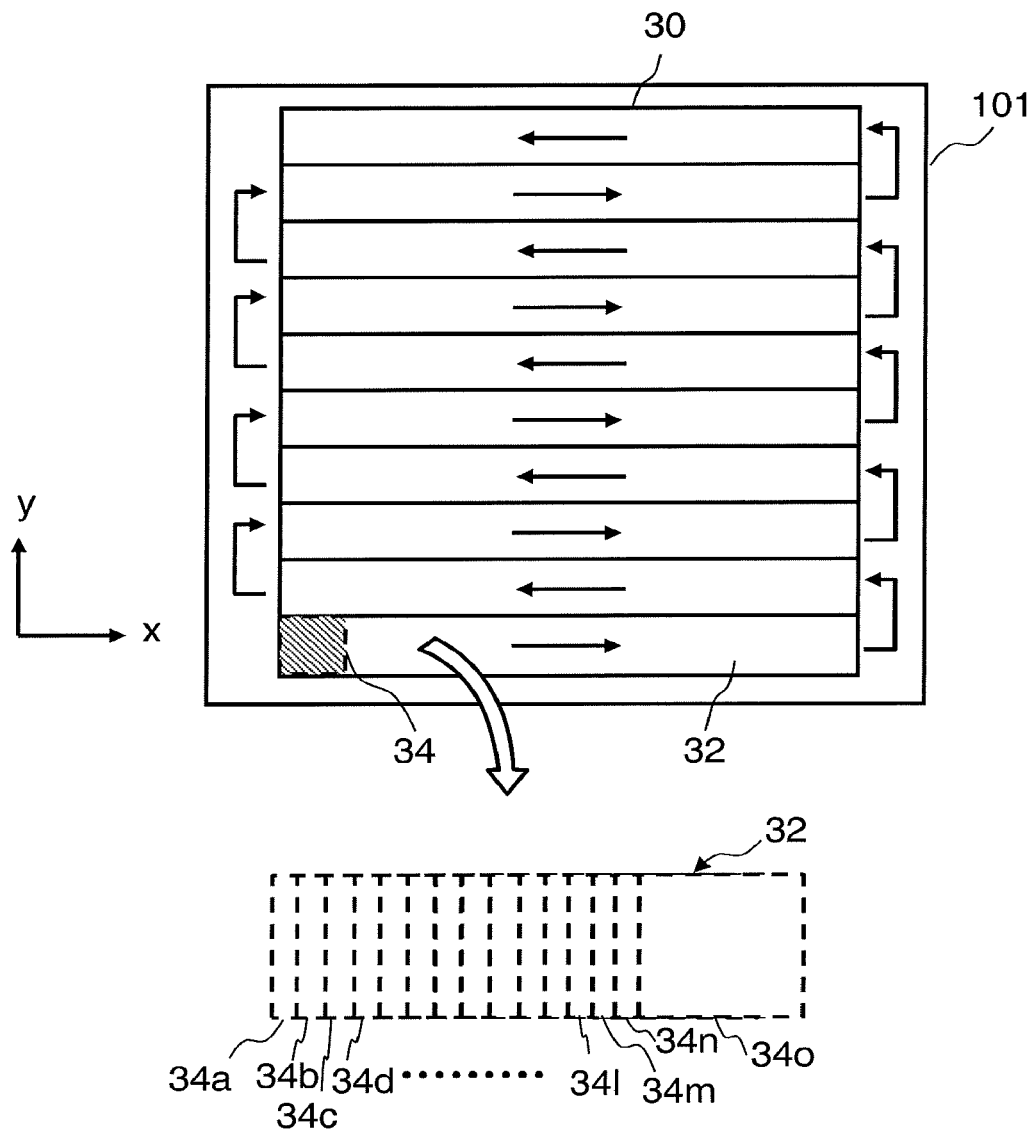
FIG. 13 is a conceptual diagram explaining an example of a writing operation according to the first embodiment.

FIG. 13 is a conceptual diagram explaining an example of a writing operation according to the first embodiment. As shown in FIG. 13, a writing region 30 of the target object 101 is virtually divided by a predetermined width in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position further left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of multi-beams having been formed by passing through the holes 22 in the shaping aperture array substrate 203.

Figure 14:
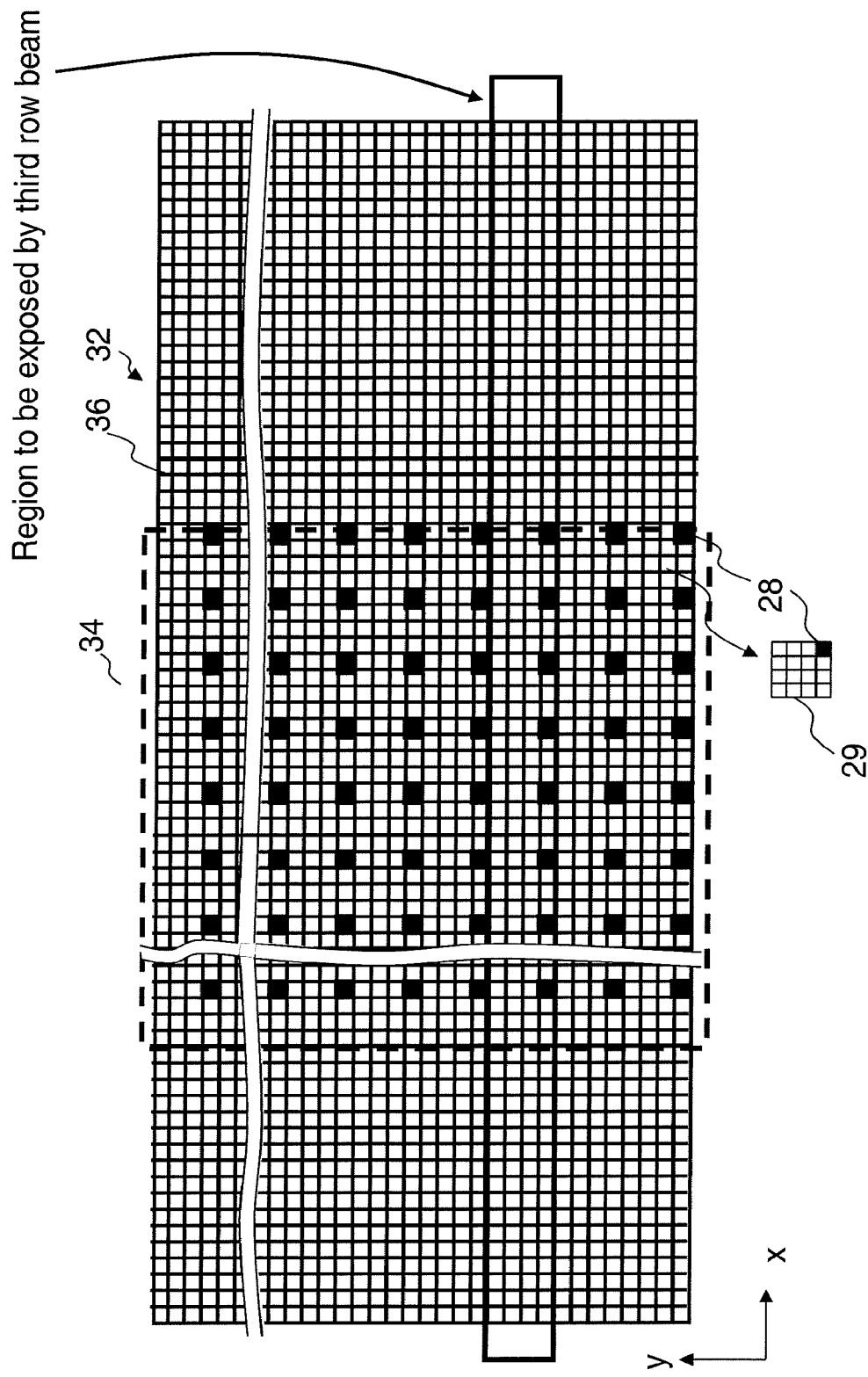
FIG. 14 shows an example of an irradiation region of multi-beams and a pixel to be written (writing pixel) according to the first embodiment.

FIG. 14 shows an example of an irradiation region of multi-beams and a pixel to be written (writing pixel) according to the first embodiment. In FIG. 14, the stripe region 32 is divided into a plurality of mesh regions by the beam size of each of the multi-beams, for example. Preferably, it is divided into a plurality of mesh regions each having the size around 10 nm. Each mesh region serves as a writing pixel 36 (unit irradiation region, irradiation position, or writing position). The size of the writing pixel 36 is not limited to the beam size, and may be an arbitrary size regardless of the beam size. For example, it may be 1/n (n being an integer of 1 or more) of the beam size. FIG. 14 shows the case where the writing region of the target object 101 is divided, for example, in the y direction, into a plurality of stripe regions 32 by the width size being substantially the same as the size of the irradiation region 34 (writing field) which can be irradiated with one irradiation of the multi-beams 20. The width of the stripe region 32 is not limited to this. Preferably, the width of the stripe region 32 is n times (n being an integer of 1 or more) the size of the irradiation region 34. FIG. 14 shows the case of multi-beams of 512 (rows)×512 (columns) being simplified to 8×8. In the irradiation region 34, there are shown a plurality of pixels 28 (beam writing positions) which can be irradiated with one shot of the multi-beams 20. In other words, the pitch between adjacent pixels 28 is the pitch between beams of the multi-beams. In the example of FIG. 14, one grid 29 is a square region surrounded by four adjacent pixels 28 at four corners and including one of the four pixels 28. In the case of FIG. 14, each grid 29 is composed of 4×4 pixels.

Then, as shown in FIG. 13, writing processing proceeds using the multi-beams 20 by repeating a beam shot while shifting the irradiation region 34 per pixel 36. Operations of the writing mechanism 150 in the writing apparatus 100 will be concretely described below.

The electron beam 200 emitted from the electron gun 201 (emission source) almost perpendicularly (vertically) illuminates the whole of the shaping aperture array substrate 203 by the illumination lens 202. A plurality of quadrangular (rectangular) holes (openings) are formed in the shaping aperture array substrate 203. The region including all the plurality of holes is irradiated by the electron beam 200. For example, a plurality of quadrangular electron beams (multi-beams) 20a to 20e are formed by making portions of the electron beam 200, which irradiate the positions of a plurality of holes, individually pass through a corresponding one of the plurality of holes in the shaping aperture array substrate 203. Each of the multi-beams 20a to 20e passes through a corresponding blanker (first deflector: individual blanking mechanism) of the blanking aperture array mechanism 204. Each blanker deflects (provides blanking deflection) the electron beam 20 which individually passes through the blanker.

The multi-beams 20a to 20e having passed through the blanking aperture array mechanism 204 are reduced by the reducing lens 205, and go toward the hole in the center of the limiting aperture substrate 206. Then, the multi-beams 20 form a crossover on the limiting aperture substrate 206. At this stage, the electron beam 20, which was deflected by the blanker of the blanking aperture array mechanism 204, deviates (shifts) from the hole in the center of the limiting aperture substrate 206 and is blocked by the limiting aperture substrate 206. On the other hand, the electron beam 20 which was not deflected by the blanker of the blanking aperture array mechanism 204 passes through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in an OFF condition by the individual blanking mechanism. Then, the beam for one shot is formed by a beam which has been made during a period from becoming "beam ON" to becoming "beam OFF" and has passed through the limiting aperture substrate 206.

However, as described above, since the space for placing circuits in the blanking aperture array mechanism 204 and the amount of current to be used are restricted, there is no alternative but to have an uncomplicated control circuit 41 in regard to the amount of information of the control signal. Accordingly, it has been difficult to build in a blanking circuit which can perform an operation at high speed and high precision. Therefore, the multi-beams 20 are made to pass through the space d' between the electrodes 14 and 16 (the electrode 12 in the latter stage) of the common blanking deflector 212, and the entire multi-beams 20 is collectively deflected for blanking control. According to the first embodiment, as described above, sufficient deflection can be provided by the configuration using the three electrodes 12, 14, and 16. Furthermore, by using, from the coaxial cable of the input side of the common blanking deflector 212 to the terminating resistance of the output side, the same characteristic impedance as that of the transmission line, it becomes possible to avoid (or reduce) signal reflection, thereby improving the high speed response. Therefore, the irradiation time can be highly accurately controlled by the common blanking deflector 212. For controlling the irradiation time by collectively deflecting the entire multi-beams 20, one shot is divided into a plurality of divided shots, and divided shots are combined to obtain a desired irradiation time for each pixel 36 (beam), for example.

The multi-beams 20, being in a beam ON condition by the blanking control and having passed through the limiting aperture substrate 206, are focused by the objective lens 207 so as to be a pattern image of a desired reduction ratio. Respective beams (the whole of the multi-beams 20) having passed through the limiting aperture substrate 206 are collectively deflected in the same direction by the deflectors 208 and 209 in order to irradiate respective beam irradiation positions on the target object 101. Ideally, the multi-beams 20 irradiating at a time are aligned at pitches obtained by multiplying the arrangement pitch of a plurality of holes of the shaping aperture array substrate 203 by a desired reduction ratio described above.

As described above, according to the first embodiment, it is possible in multi-beam writing to perform deflection in compact size for the entire multi-beams while repeating beam ON/OFF at high speed.

Second Embodiment

In the first embodiment, three electrodes 12, 14, and 16 are arranged in parallel at each of the former stage and the latter stage of the common blanking deflector 212, it is not limited thereto. According to a second embodiment, the three electrodes 12, 14, and 16 are arranged in another state. The structure of the writing apparatus 100 in the second embodiment is the same as that of FIG. 1. The contents of the present embodiment are the same as those of the first embodiment except for what is specifically described below.

Figure 15:
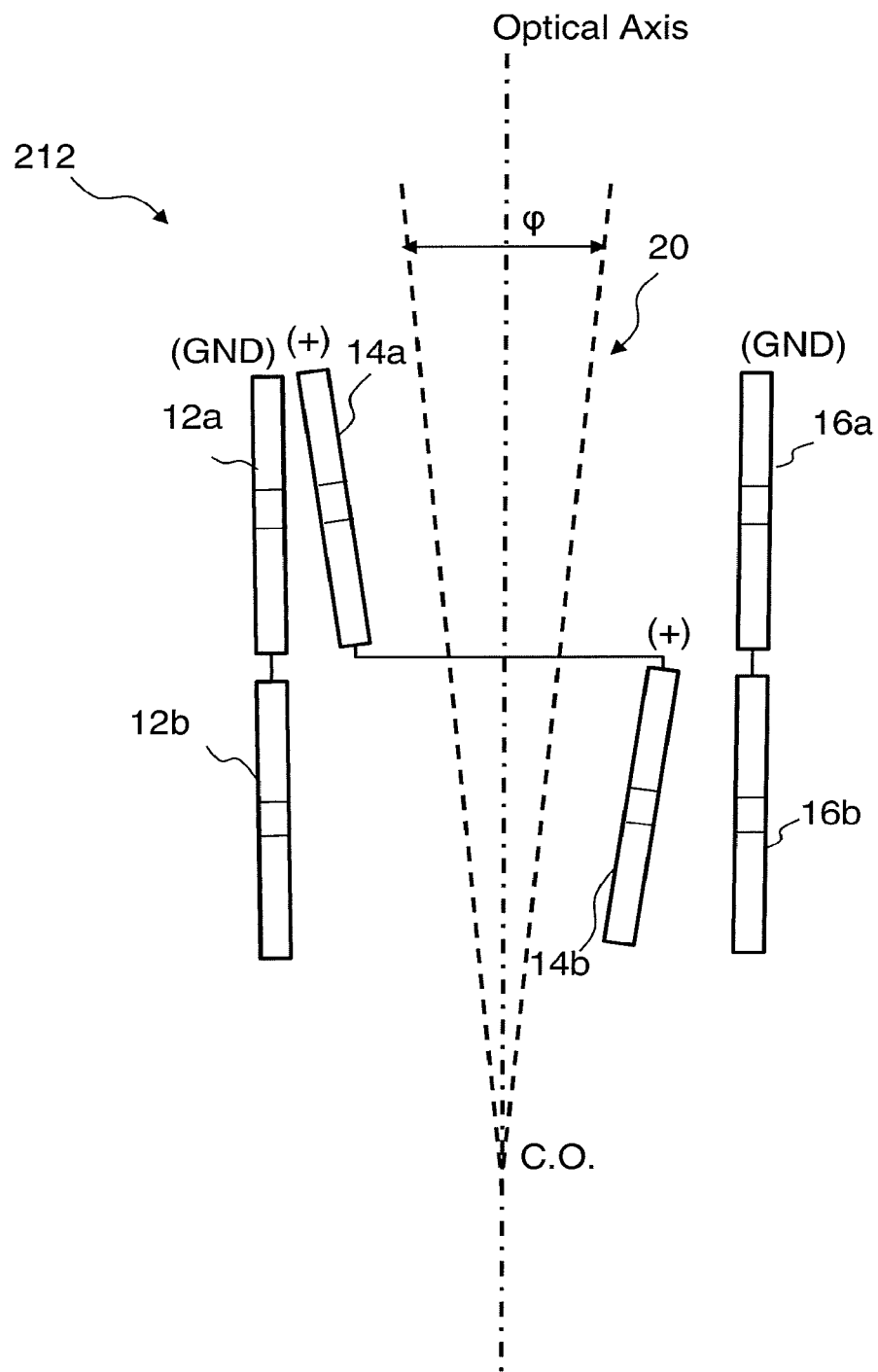
FIG. 15 shows another example of the front view of the structure of the common blanking deflector according to a second embodiment.

FIG. 15 shows another example of the front view of the structure of the common blanking deflector according to the second embodiment. The multi-beams 20 are reduced by the reducing lens 205, and go toward the hole in the center of the limiting aperture substrate 206. Then, on the limiting aperture substrate 206, the multi-beams 20 form a crossover. When the common blanking deflector 212 is arranged between the reducing lens 205 and the limiting aperture substrate 206, the beam diameter p of the multi-beams 20 becomes small gradually while passing through the common blanking deflector 212. Then, according to the second embodiment, the space d' between the electrodes 14a and 16a in the former stage, and the space d' between the electrodes 12b and 14b in the latter stage of the common blanking deflector 212 are changed depending on the beam diameter p of the entire multi-beams 20. In the example of FIG. 15, the space d' is gradually narrowed towards the output side from the input side of the common blanking deflector 212. By narrowing the space d', the deflection sensitivity can be increased and the response characteristic can be improved. Although only the electrodes 14a and 14b used as control electrodes are arranged obliquely in the example of FIG. 15, it is not limited thereto. The electrodes 12a, 12b, 16a and 16b, serving as outer corresponding electrodes, may also be arranged obliquely. Particularly, in order to make an adjustment with respect to the space d through which no beam passes, it is preferable to arrange the electrodes 12a and 16b, serving as corresponding electrodes, obliquely. The electrodes 12a, 14a, and 16a, and the electrodes 12b, 14b, and 16b should be set to individually have a certain (constant) characteristic impedance along the beam traveling direction. This can be achieved by changing the space d depending on the space d', for example.

Third Embodiment

In a third embodiment, further improvement is provided with respect to a region through which no beam passes in the structure where the electrodes 12, 14, and 16 are arranged in the common blanking deflector 212. The structure of the writing apparatus 100 in the third embodiment is the same as that of FIG. 1. The contents of the present embodiment are the same as those of the first embodiment except for what is specifically described below.

Figure 16:
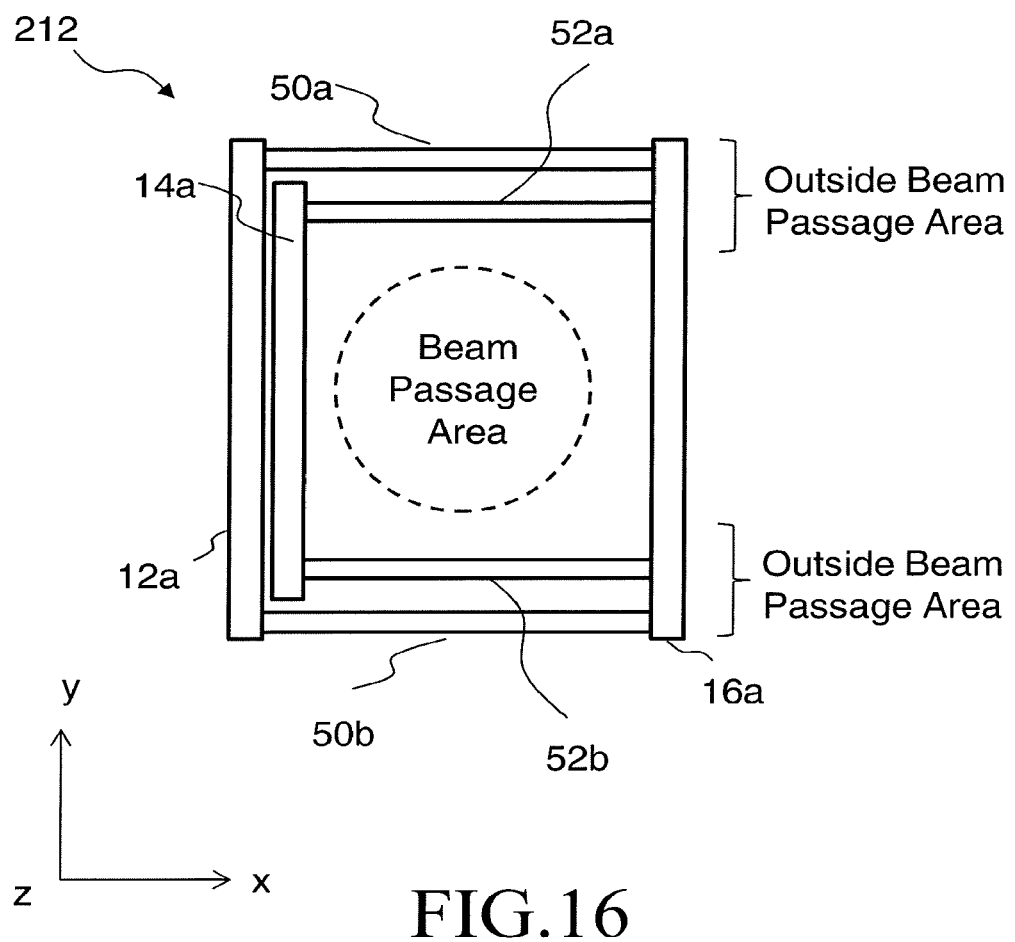
FIG. 16 is a top view showing a structure of a common blanking deflector according to a third embodiment.

FIG. 16 is a top view showing a structure of a common blanking deflector according to the third embodiment. It is assumed that multi-beams 20 travel from upper to lower, that is from the front side to the back side of FIG. 16. As described above, in the common blanking deflector 212, there are arranged the electrodes 12 and 14, with the narrow space d (first space) therebetween maintaining the proportional relation described above, and further arranged the electrode 16, with the wide space d' between the electrode 16 and the other surface of the electrode 14 opposite to its surface facing the electrode 12. Even when the multi-beams 20 passes through between the electrodes 14 and 16, there exists a region deviated from the beam passage region. Using this deviated region, the electrodes 14 and 16 are connected by a high resistance material. In the case of FIG. 16, in the regions on both sides between the electrodes 14 and 16, excluding the central portion through which the multi-beams 20 passes, each of bars 52a and 52b (resistors) of high resistance material connects the electrodes 14 and 16. Thereby, the mechanical structure between the electrodes 14 and 16 can be improved, and the influence of the circumferential electric field on the trajectory of the multi-beams 20 can be reduced. It is preferable for the high resistance material to be, for example, high resistance silicon carbide (SiC), aluminium oxide ($Al_2O_3$) coated with a high resistance film, or the like. Moreover, it is preferable for the resistance value to be sufficiently higher than the characteristic impedance, for example, to be equal to or greater than 1MΩ when the characteristic impedance is 50 Ωs.

Moreover, with respect to the region between the counter electrodes 12 and 16, they are connected by a high resistance material at regions deviated from the beam passage region. In the case of FIG. 16, in the regions on both sides between the electrodes 12 and 16, excluding the central portion through which the multi-beams 20 passes, each of bars 50a and 50b (resistors) of high resistance material connects the electrodes 12 and 16. Thereby, the mechanical structure between the electrodes 12 and 16 can be improved, and the influence of the circumferential electric field on the trajectory of the multi-beams 20 can be reduced. It is preferable for the high resistance material to be, for example, silicon carbide (SiC), aluminium oxide ($Al_2O_3$) coated with a high resistance film, or the like. Moreover, it is preferable for the resistance value to be, for example, equal to or greater than 1MΩ. When connecting the electrodes 12 and 16 by the bars 50a and 50b of a high resistance material, it is preferable to make the distance between the electrodes 12 and 16 wider than the width w of the electrode 14 intervening between them. Since using such high resistance material causes change of the spatial distribution of permittivity, in addition to adopting a resistance component, the characteristic impedance of the transmission line formed by the electrodes 12, 14, and 16 changes a little. However, for example, if the change of the characteristic impedance is about 1Ω against 50 Ωs, it is generally within the range of allowance.

The above measure may be achieved only for one of the regions between the electrodes 14 and 16, and between the electrodes 12 and 16.

Fourth Embodiment

In the above embodiments, each of the electrodes 12, 14, and 16 is formed of conductive material, but it is not limited thereto. The fourth embodiment describes an example of another case. The structure of the writing apparatus 100 in the fourth embodiment is the same as that of FIG. 1. The contents of the present embodiment are the same as those of the first embodiment except for what is specifically described below.

In the case of inputting a high frequency signal into a transmission line, the current flows along the surface of the electrodes 12, 14, and 16, and the amount of the current becomes larger where the surface electric field is stronger. On the other hand, in the case of inputting a low frequency signal or a direct current signal, the value of current at a straight-line portion depends on a resistance determined by a sectional surface of the electrode when a same material is used. Therefore, distribution of the current flowing through the electrodes 12, 14, and 16 in the case of inputting a high frequency signal is different from that in the case of inputting a low frequency signal. Accordingly, when a step-shape signal is applied, distribution of the current flowing through the electrode changes gradually, and, accompanied by this, change of the magnetic field distribution produces deflection of the beam trajectory, whose deflection amount is possibly out of range of allowance.

Figure 17:
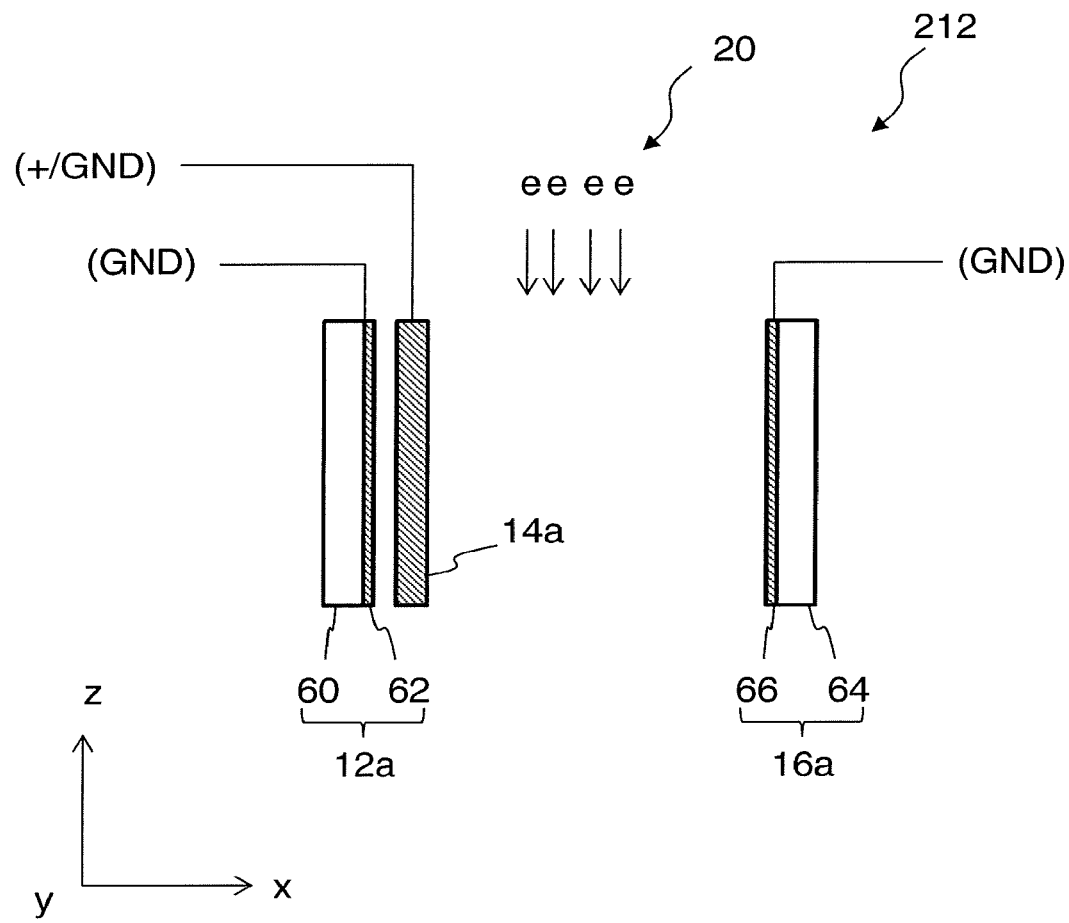
FIG. 17 is a front view showing an example of the structure of a common blanking deflector according to a fourth embodiment.

FIG. 17 is a front view showing an example of the structure of a common blanking deflector according to the fourth embodiment. FIG. 17 shows a structure of the former stage side of the common blanking deflector 212 which provides a two-stage deflection. The structure of the latter stage side is not shown in the figure. In the example of FIG. 17, the electrode 14a used as a control electrode is formed of conductive material. On the other hand, the electrode 12a serving as a counter electrode is formed using a substrate 60 by insulating material, where there is formed, on the surface of the substrate 60, a conductive film 62 thinner than the surface thickness which is determined by the maximum value of a target signal frequency, for example. Similarly, the electrode 16a serving as a counter electrode is formed using a substrate 64 by insulating material, where there is formed, on the surface of the substrate 64, a conductive film 66 thinner than the surface thickness which is determined by the maximum value of a target signal frequency, for example. Although, in the case of FIG. 17, the thin films are shown only on the surfaces facing the electrode 14 of the substrates 60 and 64, it is preferable to form a conductive thin film all over the surfaces of the substrates 60 and 64. By this structure, it is possible, when a positive potential is applied to the electrode 14a, to quickly converge the change of the magnetic field. Therefore, the rise of deflection voltage for blanking can be carried out quickly. When the maximum value of the frequency of a blanking deflection voltage signal is about 300 MHz, if copper (cu), for example, is used as a material of the films 62 and 66, it is preferable for the film thickness to be 4 μm or less, for example, 3 μm. The lower limit of the thickness is determined so that the direct current total resistance of the electrodes defined as the resistance between the ground part connected with counter electrodes 12 and 16 and active part connected with control electrode 14 measured at the input terminal when the output terminal is shorted is significantly smaller than the characteristic impedance of the transmission line, for example smaller than 0.1Ω to the characteristic impedance of 50Ω.

Figure 18:
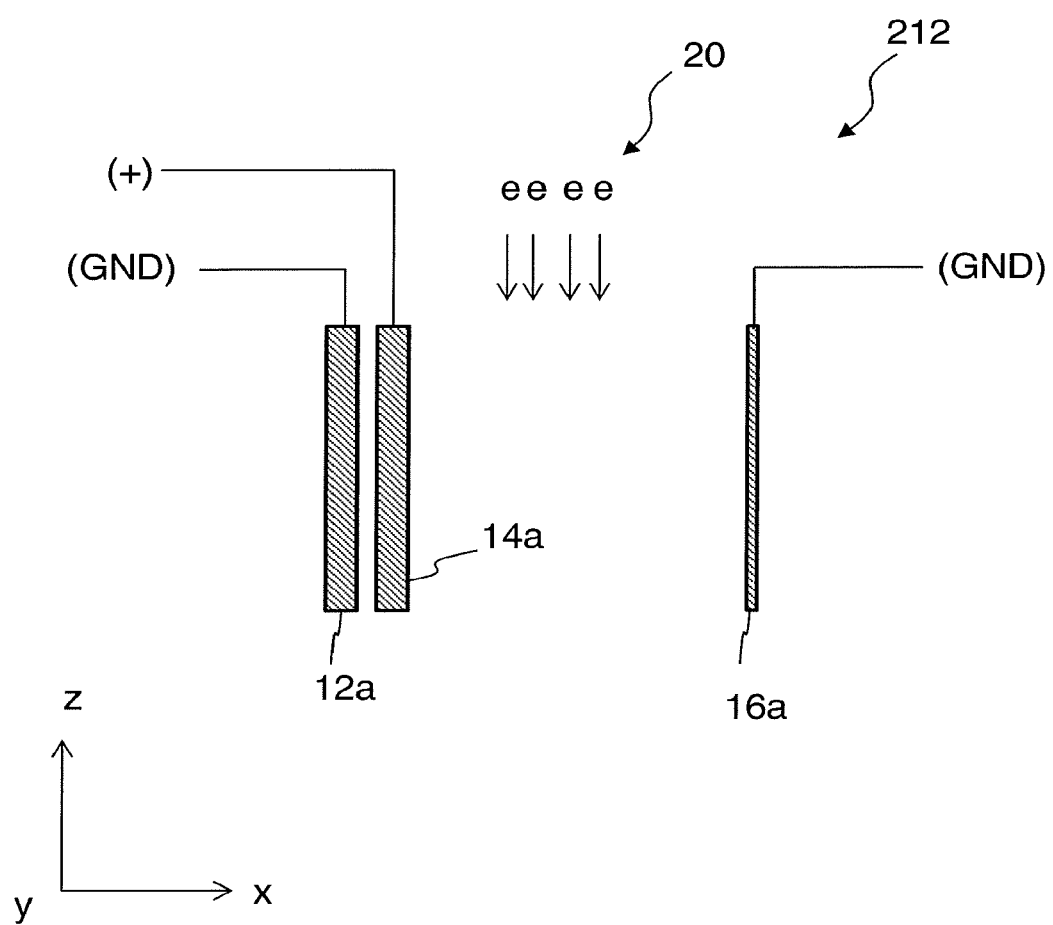
FIG. 18 is a front view showing another example of the structure of the common blanking deflector according to the fourth embodiment.

FIG. 18 is a front view showing another example of the structure of the common blanking deflector according to the fourth embodiment. FIG. 18 shows a structure of the former stage side of the common blanking deflector 212 which provides a two-stage deflection. The structure of the latter stage side is not shown in the figure. In the example of FIG. 18, the electrodes 12a, 14a, and 16a are formed of conductive material. The thickness of the electrode 16a, serving as a counter electrode, with a wide space d' between the electrode 16a and the electrode 14a used as a control electrode should be thinner than the thickness of the electrode 12a, serving as another counter electrode, with a narrow space d between the electrodes 12a and 14a. Distribution of the thickness of the electrode 14a and electrode 16a should be determined such that the ratio of the amount of current which flows through electrode 14a and the amount of current which flows through electrode 16a obtained by applying a direct current voltage is the same as the ratio of the amount of current which flows through electrode 14a and the amount of current which flows through electrode 16a obtained by applying a high frequency signal. By this, it is possible to reduce the change of the magnetic field distribution in the deflector after a step signal has been input.

Figure 19:
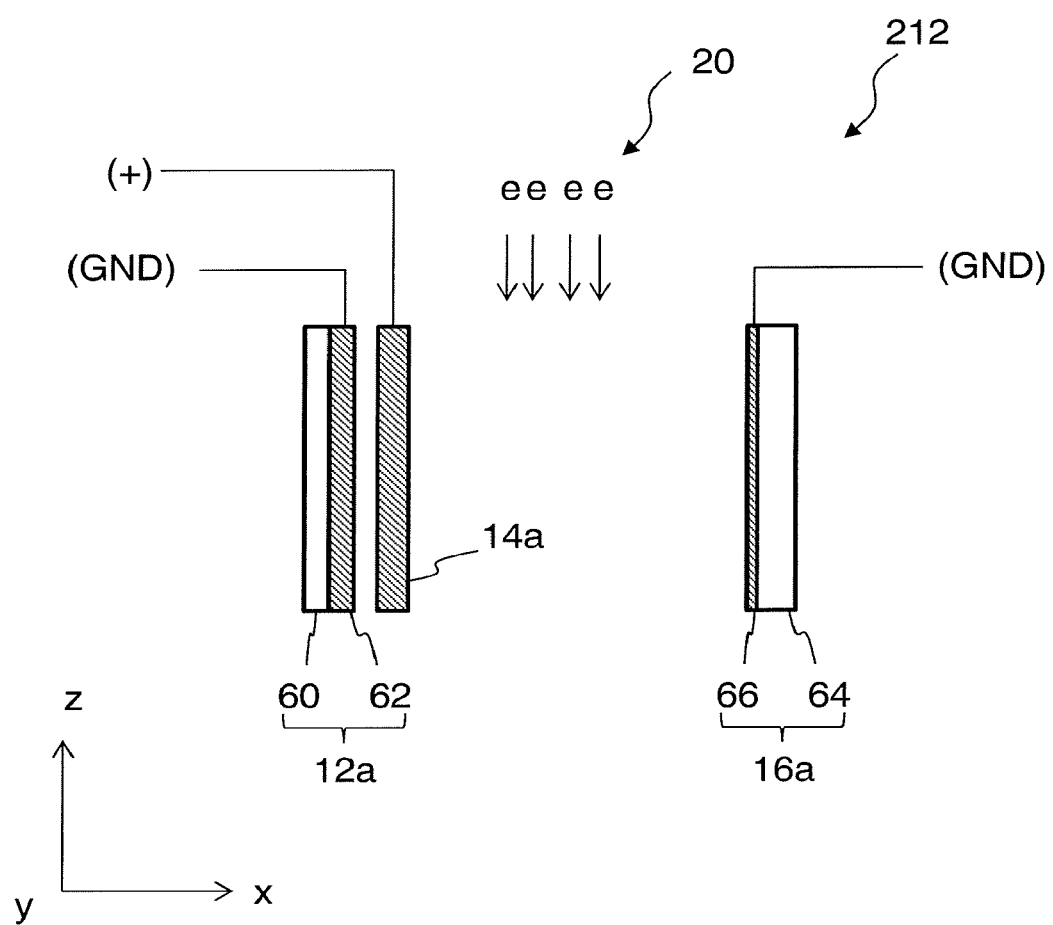
FIG. 19 is a front view showing another example of the structure of the common blanking deflector according to the fourth embodiment.

FIG. 19 is a front view showing another example of the structure of the common blanking deflector according to the fourth embodiment. FIG. 19 shows the case where the thickness of the electrodes shown in FIG. 18 is adjusted by the thin films 62 and 66. Specifically, the electrode 14a used as a control electrode is formed of conductive material. On the other hand, the electrode 12a serving as a counter electrode is formed using the substrate 60 by insulating material, where the conductive thin film 62 is formed on the surface of the substrate 60, for example. Similarly, the electrode 16a serving as a counter electrode is formed using the substrate 64 by insulating material, where the conductive film 66 is formed on the surface of the substrate 64, for example. In that case, the film thickness distributions of the films 66 and 62 are made to be proportional to the intensities of the electric field generated on the surfaces of the electrodes 12 and the 16 when a voltage is applied to the electrode 14. This enables to equalize the distributions of the current flowing along the surfaces of the electrodes 14 and 16 in the high frequency case and in the low frequency case, thereby reducing change of the magnetic field distribution in the beam trajectory at the time of a pulse signal being applied. With respect also to the electrode 14, its effect can further be improved by forming a conductive film on the surface of a substrate by insulating material, and making the film thickness distribution be proportional to the intensity of the electric field generated on the surface of the electrode 14 when a voltage is applied to the electrode 14. Although, in the example of FIG. 19, similarly to the example of FIG. 17, the thin films are shown only on the surfaces facing the electrode 14 of the substrates 60 and 64, it is preferable to form a conductive thin film all over the surfaces of the substrates 60 and 64.

Fifth Embodiment

Although, in the first embodiment, the electrodes 12, 14, and 16 are formed in a zigzag manner, it is not limited thereto. A fifth embodiment describes an example of another case. The structure of the writing apparatus 100 in the fifth embodiment is the same as that of FIG. 1. The contents of the present embodiment are the same as those of the first embodiment except for what is specifically described below.

Figure 20B:
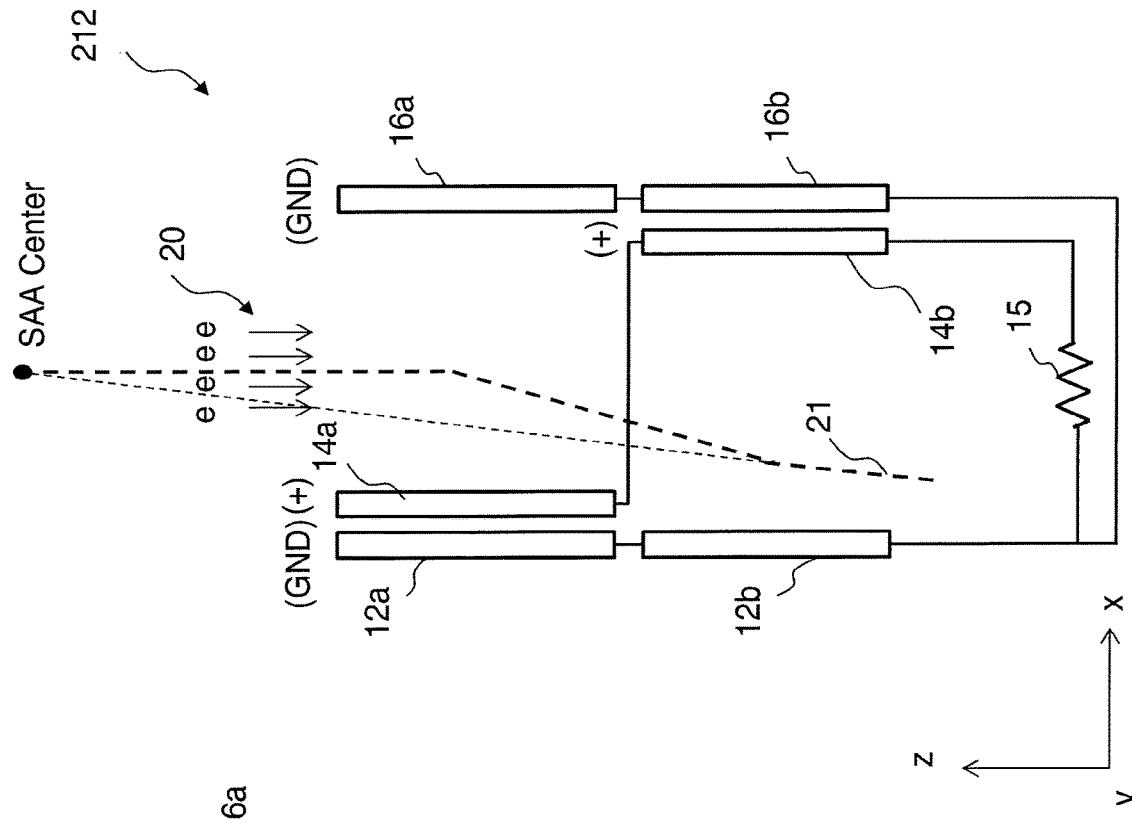
FIGS. 20A and 20B show front and left side views of the structure of a common blanking deflector according to a fifth embodiment.
Figure 20A:
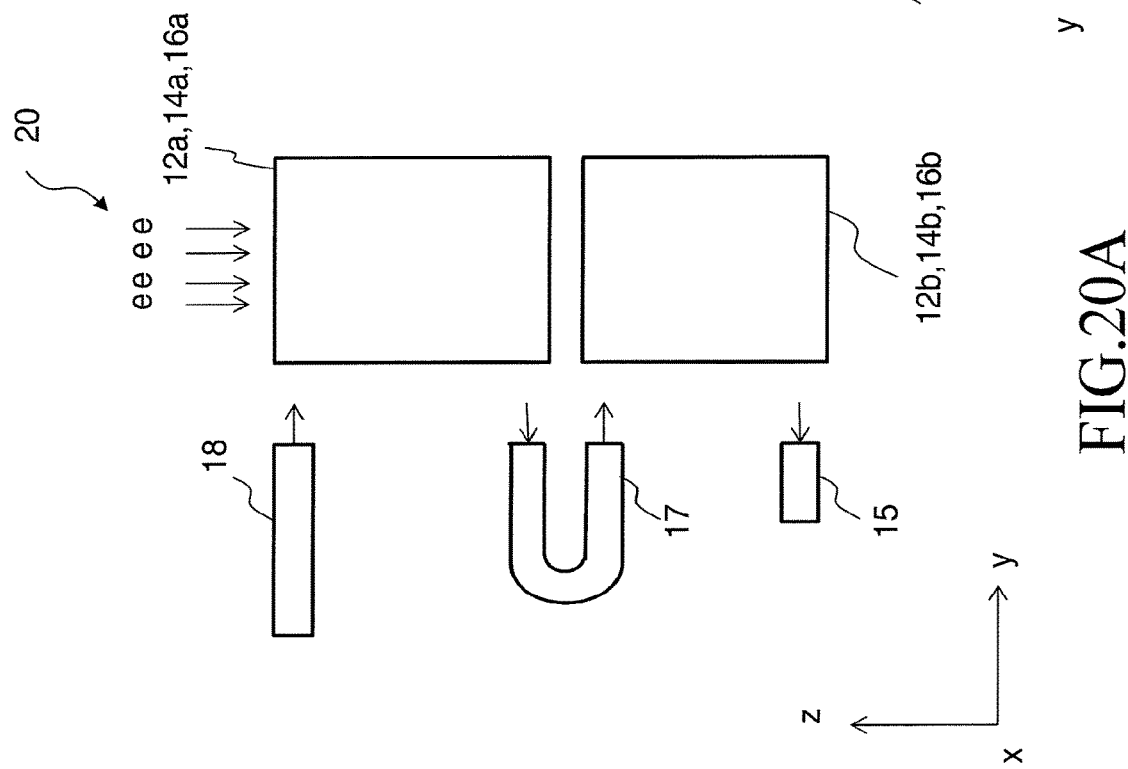

FIGS. 20A and 20B show front and left side views of the structure of a common blanking deflector according to the fifth embodiment. FIG. 20A shows the left side view of the common blanking deflector 212 according to the fifth embodiment. FIG. 20B shows the front view of the common blanking deflector 212 according to the fifth embodiment. In FIGS. 20A and 20B, each of the electrodes 12a, 14a, and 16a in the former stage side and the electrodes 12b, 14b, and 16b in the latter stage side of the two-stage deflector is formed not in the shape of a zigzag but in the shape of a straight plate. Although not shown, each of the shapes of the electrodes 12a, 14a, 16a, and/or the electrodes 12b, 14b, and 16b at each of connection parts between the cable 18 of the input and the electrodes 12a, 14a, and 16a, between the connecting cable 17 and the electrodes 12a, 14a, 16a, 12b, 14b, and 16b, and between the terminating resistance 15 of the output and the electrodes 12b, 14b, and 16b is gradually changed in order to suppress reflection of a pulse at the corresponding connection. With this structure, as described with reference to FIG. 8A, a magnetic field is generated in the direction always orthogonal to the traveling direction (beam trajectory) of the multi-beams 20. Therefore, it becomes more affected by the magnetic field compared to the case of the zigzag in the first embodiment. However, even in such a case, it is possible to provide a blanking deflection at high speed for the multi-beams 20 with a large beam diameter between the electrodes 14a and 16a and between the electrodes 12b and 14b.

Sixth Embodiment

A sixth embodiment describes a connecting structure of a coaxial cable being different from that of the first embodiment. The structure of the writing apparatus 100 in the sixth embodiment is the same as that of FIG. 1. The contents of the present embodiment are the same as those of the first embodiment except for what is specifically described below.

Figures 21A, 21B:
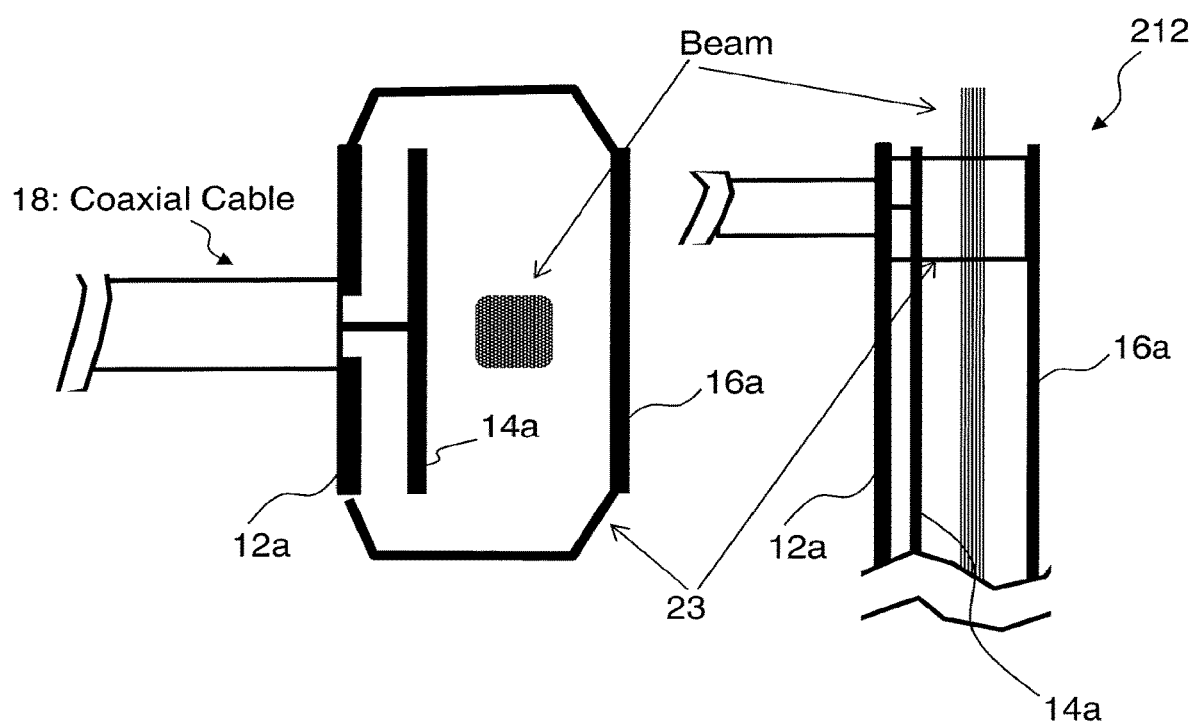
FIGS. 21A and 21B show an example of connection between three electrodes and a coaxial cable according to a sixth embodiment.

FIGS. 21A and 21B show an example of connection between three electrodes and a coaxial cable according to the sixth embodiment. FIG. 21A shows a top view of the common blanking deflector 212. FIG. 21B shows a front view of the common blanking deflector 212. In FIGS. 21A and 21B, a through-hole is formed in the electrode 12a, the outer conductor of the coaxial cable 18 is connected to the electrode 12a near the through-hole, and the central conductor of the coaxial cable 18 passes through the through-hole of the electrode 12a to be connected to the input side terminal of the electrode 14a used as a control electrode. The electrodes 12a and 16a serving as counter electrodes (ground electrode) that sandwich the electrode 14a are electrically connected to each other, at an end(s) in the width direction at the input side, by the conductive plate 23. As shown in FIG. 21A, the coaxial cable 18 which extends outside the common blanking deflector 212 is connected to the electrode 12a from the direction orthogonal to the traveling direction of the multi-beams 20. Therefore, this structure enables not to interfere with the beam trajectory. Moreover, even when connected by the conductive plate 23, this structure enables not to interfere with the beam trajectory.

Seventh Embodiment

A seventh embodiment describes an example of the structure of an electrode of the common blanking deflector 212 whose traveling wave of electric potential goes straight. The structure of the writing apparatus 100 in the seventh embodiment is the same as that of FIG. 1. The contents of the present embodiment are the same as those of the first embodiment except for what is specifically described below.

Figure 22:
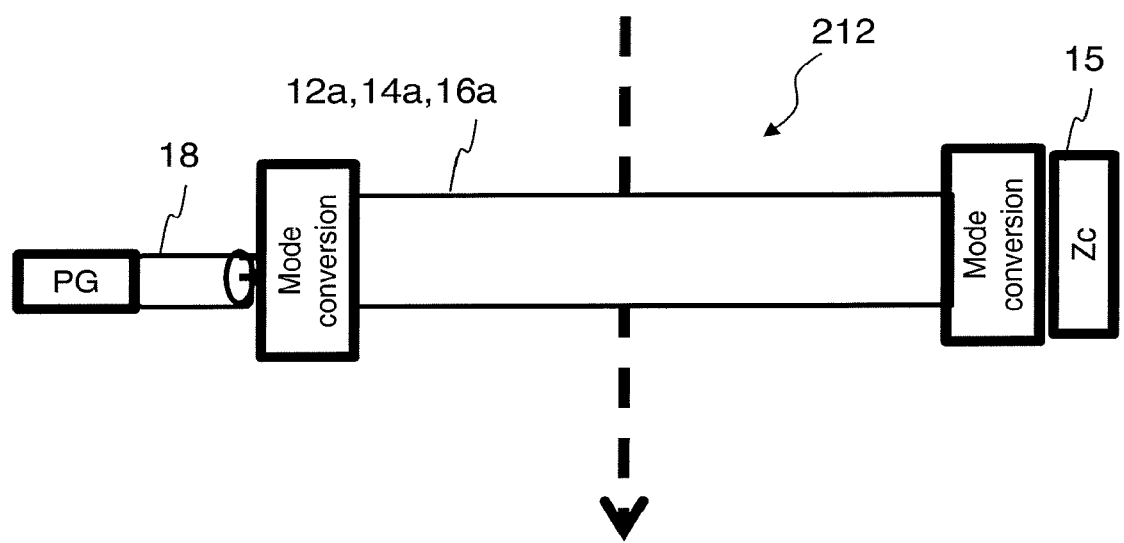
FIG. 22 shows an example of connection between three electrodes and a coaxial cable according to a seventh embodiment.

FIG. 22 shows an example of connection between three electrodes and a coaxial cable according to the seventh embodiment. FIG. 22 shows the case where the former stage (former-stage deflector) and the latter stage (latter-stage deflector) of the common blanking deflector 212 being a two-stage deflector are not connected to each other so as to be arranged independently. The example of FIG. 22 shows the former stage. In each of Embodiments described above, the output side of the transmission line is located lower than the input side, that is located at the downstream side of the beam trajectory of the multi-beams 20. However, in FIG. 22, a potential traveling wave goes in the direction orthogonal to the beam trajectory of the multi-beams 20. The parallel plate electrodes 12, 14, and 16 extend in the direction orthogonal to the beam trajectory of the multi-beams 20. One end of each of the electrodes 12, 14, and 16 is connected to the coaxial cable 18, and the other end is connected to the terminating resistance. By this structure, as described with reference to FIG. 8B, a magnetic field is generated in the same or opposite direction with respect to the traveling direction (beam trajectory) of the multi-beams 20. Therefore, similarly to the case of the zigzag as described in the first embodiment, positional deviation in the direction orthogonal to the beam trajectory of the multi-beams 20, caused by influence of a magnetic field, can be avoided or reduced.

Figure 23:
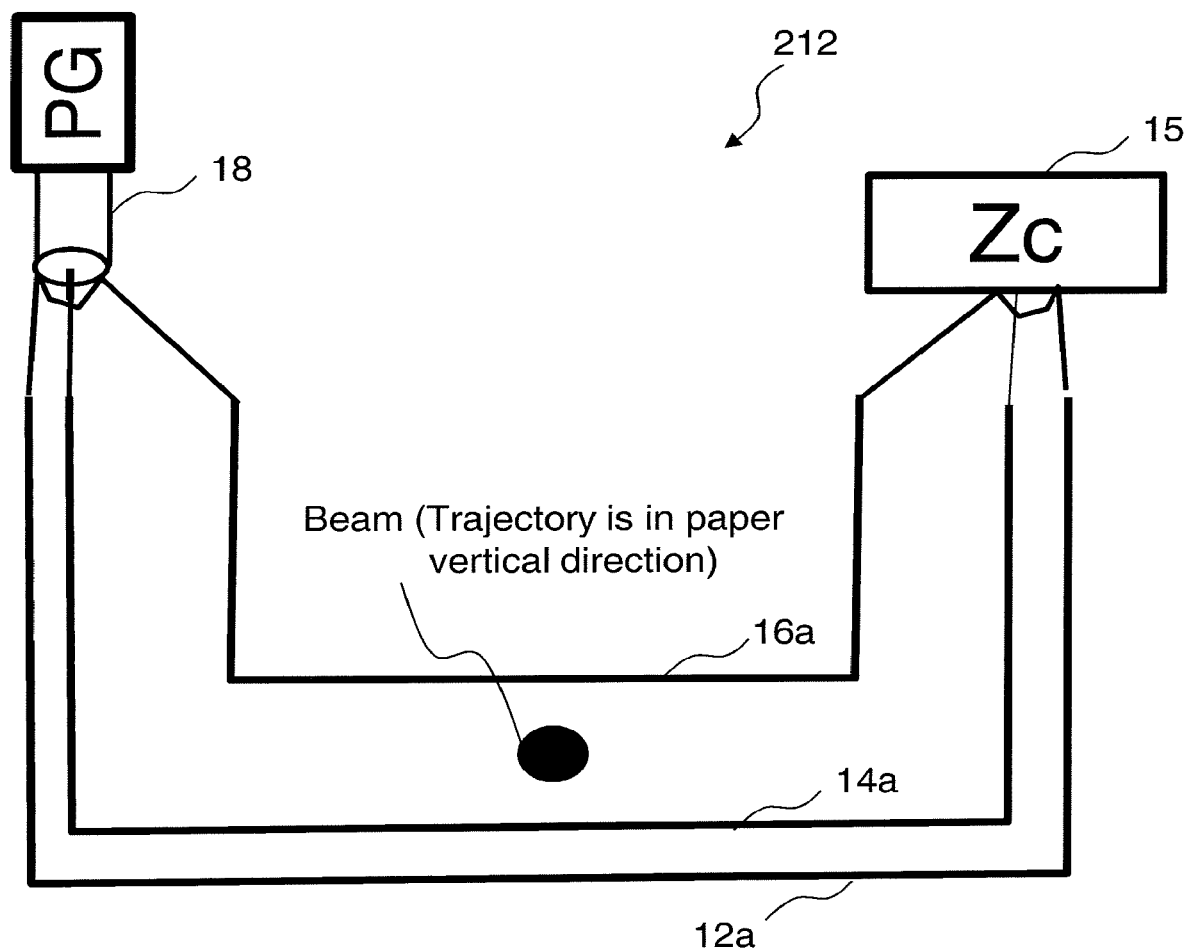
FIG. 23 shows a modified example of connection between three electrodes and a coaxial cable according to the seventh embodiment.

FIG. 23 shows a modified example of connection between three electrodes and a coaxial cable according to the seventh embodiment. FIG. 23 shows a top view. The input side and the output side of the electrodes 12, 14, and 16 are bent by 90 degrees in the same direction, for example. Thereby, the direction of connection of the coaxial cable 18 can be shifted by 90 degrees. Similarly, the direction of connection of the terminating resistance can be shifted by 90 degrees. Therefore, the space in the narrow electron optical column 102 can be used efficiently.

Eighth Embodiment

Although, in the fifth embodiment, the electrodes 12, 14, and 16 are formed straight along the traveling direction (beam trajectory) of the multi-beams 20, an eighth embodiment describes a modified example of the fifth embodiment. The structure of the writing apparatus 100 in the eighth embodiment is the same as that of FIG. 1. The contents of the present embodiment are the same as those of the first embodiment except for what is specifically described below.

Figures 24A, 24B:
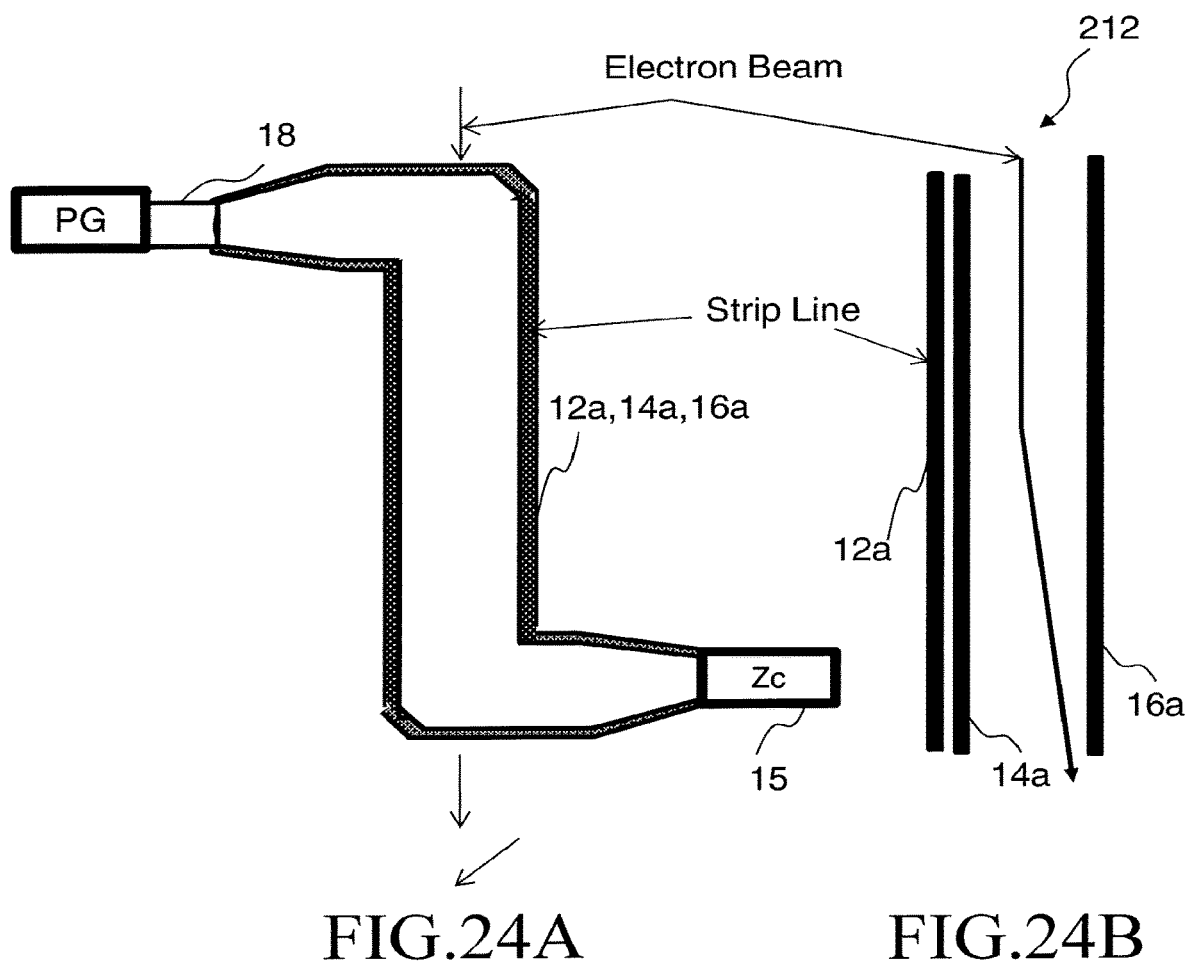
FIGS. 24A and 24B show front and left side views of the structure of a common blanking deflector according to an eighth embodiment.

FIGS. 24A and 24B show front and left side views of the structure of a common blanking deflector according to the eighth embodiment. FIG. 24A shows the left side view of the common blanking deflector 212 according to the eighth embodiment. FIG. 24B shows the front view of the common blanking deflector 212 according to the eighth embodiment. FIGS. 24A and 24B show the case where the former stage (former-stage deflector) and the latter stage (latter-stage deflector) of the common blanking deflector 212 being a two-stage deflector are not connected to each other so as to be arranged independently. The example of FIGS. 24A and 24B shows the former stage. The input side and the output side of the electrodes 12, 14, and 16, which are formed straight along the traveling direction (beam trajectory) of the multi-beams 20, are bent by 90 degrees in the opposite directions, for example. With this shape, the coaxial cable 18 can be connected with the input terminal of the transmission line from the same direction as the transmission line of the electrodes 12, 14, and 16. Moreover, the terminating resistance can be connected with the output terminal of the transmission line from the same direction as the transmission line of the electrodes 12, 14, and 16. By this structure, it is possible to arrange the coaxial cable 18 and the terminating resistance without interfering with the traveling direction (beam trajectory) of the multi-beams 20.

Ninth Embodiment

Although, in the first embodiment, a blanking control signal is input from one end of each of the electrodes 12, 14, and 16, it is not limited thereto. The ninth embodiment describes the case of inputting it from another position of each of the electrodes 12, 14, and 16. The structure of the writing apparatus 100 in the ninth embodiment is the same as that of FIG. 1. The contents of the present embodiment are the same as those of the first embodiment except for what is specifically described below.

FIGS. 25A and 25B show front and left side views of the structure of a common blanking deflector according to the ninth embodiment. FIG. 25A shows the left side view of the common blanking deflector 212 according to the ninth embodiment. FIG. 25B shows the front view of the common blanking deflector 212 according to the ninth embodiment. FIGS. 25A and 25B show the case where the former stage (former-stage deflector) and the latter stage (latter-stage deflector) of the common blanking deflector 212 being a two-stage deflector are not connected to each other so as to be arranged independently. The example of FIGS. 25A and 25B shows the former stage. As shown in FIG. 25A, the electrodes 12a, 14a, and 16a are formed extending in a zigzag manner while folding back by 180 degrees. However, unlike FIG. 5A, the coaxial cable is connected to the middle position of the electrodes 12a, 14a, and 16a. One end of each of the electrodes 12, 14, and 16 is connected to a terminating resistance, and the other end is similarly connected to a terminating resistance. By this configuration, there are generated a magnetic field upper than the middle position of the electrodes 12a, 14a, and 16a, and a magnetic field lower than that, whose directions are opposite to each other, thereby negating/cancelling each other. Therefore, the influence of the magnetic field on the passing multi-beams 20 can be further reduced. In that case, if the characteristic impedance of the coaxial cable 18 is defined to be Zc, the values of the characteristic impedance of the transmission line configured by the electrodes 12a, 14a, and 16a, and the characteristic impedance of each of the terminating resistances 15 are set to be 2Zc.

Regarding what is described above, in the configuration where the former stage and the latter stage of the common blanking deflector 212 being a two-stage deflector are connected to each other, a pulse of a blanking control signal (deflection voltage) is generated from one pulse generator (not shown) in the logic circuit 131, and the signal is sent to the input side of the former-stage deflector. As a result, the pulse (potential traveling wave) of the blanking control signal (deflection voltage) flows through the deflector in the former stage, and then, through the deflector in the latter stage. On the other hand, in the configuration where the former stage and the latter stage of the common blanking deflector 212 being a two-stage deflector are not connected to each other, a pulse of a blanking control signal (deflection voltage) is generated from each of two pulse generators (not shown) in the logic circuit 131, a signal is sent from the one pulse generator to the input side of the former-stage deflector, and another signal is sent from the other pulse generator to the input side of the latter-stage deflector. Thus, by sending blanking control signals (deflection voltage) from different pulse generators, transmission delay of the blanking control signal (deflection voltage) to the latter-stage deflector can be eliminated. Moreover, by sending blanking control signals (deflection voltage) from different pulse generators, the generation timing of the blanking control signal (deflection voltage) can be adjusted depending on the velocity of an electron beam.

Moreover, even in the configuration of Embodiment described above where the former stage and the latter stage of the common blanking deflector 212 being a two-stage deflector are connected to each other, it is also preferable to input a blanking control signal (deflection voltage) from separated/different pulse generators without connecting the former-stage deflector and the latter-stage deflector.

Embodiments have been explained referring to specific examples described above. However, the present invention is not limited to these specific examples.

While the case of inputting a 1-bit control signal into each control circuit 41 has been described above, the number of bits may be suitably set. For example, a control signal of greater than or equal to 2 bits and less than 10 bits may be used.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other blanking device for multi charged particle beams, and multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking deflector comprising:
 a first electrode including first and second electrode portions each formed to be plate-like;
 a second electrode including first and second electrode portions each configured to be electrically separated from the first electrode; and
 a third electrode including first and second electrode portions each configured to be electrically separated from the first electrode, wherein
 the first electrode is arranged between the second electrode and the third electrode,
 the first electrode portions of the first, second, and third electrodes face each other and form a first electrode stage, the second electrode portions of the first, second, and third electrodes face each other and form a second electrode stage downstream of the first stage in a transmission direction of a charged particle beam,
 in the first electrode stage the first electrode portion of the first electrode is closer to the first electrode portion of the second electrode than the first electrode portion of the third electrode, and in the second electrode stage, the second electrode portion of the first electrode is closer to the second electrode portion of the third electrode than the second electrode portion of the second electrode,
 a transmission line is formed by the first, second, and third electrodes, the second and third electrodes are electrically connected at, at least, an input side and an output side, in the transmission line, the first and the second electrodes are electrically connected by a terminating resistance at an output side in the transmission line,
 whole multi-beams of the charged particle beam are made to pass through a space between the first and third electrodes, and
 the whole multi-beams are collectively deflected for blanking control by a voltage signal applied from the input side to between the first electrode and the third electrode and between the first electrode and the second electrode.

2. The deflector according to claim 1, wherein
 a coaxial cable having a characteristic impedance substantially same as a characteristic impedance of the transmission line is connected to an input side of the transmission line so as to apply the voltage signal from the coaxial cable, and
 a terminating resistance having a characteristic impedance substantially same as the characteristic impedance of the transmission line is connected to an output side of the transmission line.

3. The deflector according to claim 1, wherein each of the first, second, and third electrodes is formed of a plate-like member extending in a zigzag manner.

4. The deflector according to claim 1, wherein the space between the first and third electrodes changes depending on a beam diameter of a whole of the multi-beams.

5. The deflector according to claim 1, further comprising:
 a resistor configured to connect the first and third electrodes at a region deviated from a beam passage region through which the multi-beams passes, in a region of the space between the first and third electrodes.

6. The deflector according to claim 1, wherein
 each of the first and third electrodes includes an insulating substrate and a conductive film formed on the insulating substrate, and
 the second electrode itself is formed of conductive material.

7. A multi charged particle beams writing apparatus comprising:
 an emission source configured to emit a charged particle beam;
 a shaping aperture array substrate, in which a plurality of first openings are formed, configured to form multi-beams by making a region including a whole of the plurality of first openings irradiated with the charged particle beam, and making portions of the charged particle beam individually pass through a corresponding one of the plurality of first openings;
 a blanking deflector including
 a first electrode including first and second electrode portions each formed to be plate-like,
 a second electrode including first and second electrode portions each configured to be electrically separated from the first electrode, and
 a third electrode including first and second electrode portions each configured to be electrically separated from the first electrode, wherein
 the first electrode is arranged between the second electrode and the third electrode, the first electrode portions of the first, second, and third electrodes face each other and form a first electrode stage, the second electrode portions of the first, second, and third electrodes face each other and form a second electrode stage downstream of the first stage in a transmission direction of a charged particle beam, in the first electrode stage the first electrode portion of the first electrode is closer to the first electrode portion of the second electrode than the first electrode portion of the third electrode, and in the second electrode stage, the second electrode portion of the first electrode is closer to the second electrode portion of the third electrode than the second electrode portion of the second electrode, a transmission line is formed by the first, second, and third electrodes, the second and third electrodes are electrically connected at, at least, an input side and an output side, the first and the second electrodes are electrically connected by a terminating resistance at an output side in the transmission line, whole multi-beams of the charged particle beam are made to pass through a space between the first and third electrodes, and the whole multi-beams are collectively deflected for blanking control by a voltage signal applied from the input side to between the first electrode and the third electrode and between the first electrode and the second electrode;

a limiting aperture substrate configured to collectively block a whole of the multi-beams having been deflected to be in a beam-OFF condition by the blanking control; and a stage configured to mount thereon a target object to be written with the multi-beams having passed through the limiting aperture substrate while being in a beam-ON condition controlled by the blanking control, wherein the blanking deflector provides deflection such that an extension of a trajectory of an electron of the multi-beams passing a center of the shaping aperture array substrate and having been deflected intersects the center of the shaping aperture array substrate.

8. The apparatus according to claim 7, wherein a through-hole is formed in the first electrode, further comprising:

a coaxial cable configured to include an outer conductor connected to the first electrode near the through-hole of the first electrode, and a central conductor passing through the through-hole to be connected to an input side terminal of the second electrode.

9. A multi charged particle beams writing apparatus comprising:

an emission source configured to emit a charged particle beam;

a shaping aperture array substrate, in which a plurality of first openings are formed, configured to form multi-beams by making a region including a whole of the plurality of first openings irradiated with the charged particle beam, and making portions of the charged particle beam individually pass through a corresponding one of the plurality of first openings;

a blanking deflector including
a first electrode including first and second electrode portions each formed to be plate-like,
a second electrode including first and second electrode portions each configured to be electrically separated from the first electrode, and
a third electrode including first and second electrode portions each configured to be electrically separated from the first electrode, wherein
the first electrode is arranged between the second electrode and the third electrode,
the first electrode portions of the first, second, and third electrodes face each other and form a first electrode stage, the second electrode portions of the first, second, and third electrodes face each other and form a second electrode stage downstream of the first stage in a transmission direction of a charged particle beam,
in the first electrode stage the first electrode portion of the first electrode is closer to the first electrode portion of the second electrode than the first electrode portion of the third electrode in the second electrode stage, the second electrode portion of the first electrode is closer to the second electrode portion of the third electrode than the second electrode portion of the second electrode, a transmission line is formed by the first, second, and third electrodes, the second and third electrodes are electrically connected at, at least, an input side and an output side, in the transmission line, the first and the second electrodes are electrically connected by a terminating resistance at an output in the transmission line, whole multi-beams of the charged particle beam are made to pass through a space between the first and third electrodes, and the whole multi-beams are collectively deflected for blanking control by a voltage signal applied from the input side to between the first electrode and third electrode and between the first electrode and the second electrode;

a limiting aperture substrate configured to collectively block a whole of the multi-beams having been deflected to be in a beam-OFF condition by the blanking control; and a stage configured to mount thereon a target object to be written with the multi-beams having passed through the limiting aperture substrate while being in a beam-ON condition controlled by the blanking control, wherein the space between the first and third electrodes changes depending on a beam diameter of a whole of the multi-beams.

10. The apparatus according to claim 9, wherein a through-hole is formed in the first electrode, further comprising:

a coaxial cable configured to include an outer conductor connected to the first electrode near the through-hole of the first electrode, and a central conductor passing through the through-hole to be connected to an input side terminal of the second electrode.

* * * * *